(12) United States Patent
Liu et al.

(10) Patent No.: US 11,804,532 B2
(45) Date of Patent: Oct. 31, 2023

(54) GATE-ALL-AROUND DEVICES WITH SUPERLATTICE CHANNEL

(71) Applicant: Taiwan Semiconductor Manufacturing Co., Ltd., Hsinchu (TW)

(72) Inventors: Shin-Cheng Liu, Hsinchu (TW); Kuei-Shu Chang Liao, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 242 days.

(21) Appl. No.: 17/459,855

(22) Filed: Aug. 27, 2021

(65) Prior Publication Data

US 2023/0060784 A1    Mar. 2, 2023

(51) Int. Cl.

| H01L 29/423 | (2006.01) |
|---|---|
| H01L 29/06 | (2006.01) |
| H01L 29/786 | (2006.01) |
| H01L 29/66 | (2006.01) |
| H01L 29/78 | (2006.01) |
| H01L 21/8234 | (2006.01) |

(52) U.S. Cl.
CPC ......... *H01L 29/42392* (2013.01); *H01L 21/823418* (2013.01); *H01L 21/823431* (2013.01); *H01L 29/0665* (2013.01); *H01L 29/6656* (2013.01); *H01L 29/7848* (2013.01); *H01L 29/78618* (2013.01); *H01L 29/78696* (2013.01)

(58) Field of Classification Search
CPC ....... H01L 21/02603; H01L 21/823418; H01L 21/823431; H01L 21/823821; H01L 21/845; H01L 27/0886; H01L 27/0924; H01L 27/1211; H01L 29/0665; H01L 29/0669; H01L 29/0673; H01L 29/41791; H01L 29/42392; H01L 29/66439; H01L 29/66795; H01L 29/775; H01L 29/7848; H01L 29/785; H01L 29/7851; H01L 29/7853; H01L 29/7855; H01L 29/78618; H01L 29/78696; H01L 2029/7858
See application file for complete search history.

(56) References Cited

U.S. PATENT DOCUMENTS

| 9,236,267 | B2 | 1/2016 | De et al. |
|---|---|---|---|
| 9,502,265 | B1 | 11/2016 | Jiang et al. |
| 9,520,466 | B2 | 12/2016 | Holland et al. |
| 9,520,482 | B1 | 12/2016 | Chang et al. |

(Continued)

*Primary Examiner* — David C Spalla
(74) *Attorney, Agent, or Firm* — SEED IP LAW GROUP LLP

(57) ABSTRACT

A semiconductor structure is provided. The semiconductor structure includes a substrate, a first superlattice structure and a second superlattice structure over the substrate, a gate stack that surrounds a channel region of each of the first superlattice structures and the second superlattice structure, and source/drain structures on opposite sides of the gate stack contacting sidewalls of the first superlattice structure and the second superlattice structure. The second superlattice structure is disposed over the first superlattice structure. Each of the first superlattice structures and the second superlattice structure includes vertically stacked alternating first nanosheets of a first semiconductor material and second nanosheets of a second semiconductor material that is different from the first semiconductor material.

20 Claims, 14 Drawing Sheets

(56) References Cited

U.S. PATENT DOCUMENTS

| | | | |
|---|---|---|---|
| 9,536,738 B2 | 1/2017 | Huang et al. | |
| 9,576,814 B2 | 2/2017 | Wu et al. | |
| 9,608,116 B2 | 3/2017 | Ching et al. | |
| 9,786,774 B2 | 10/2017 | Colinge et al. | |
| 9,853,101 B2 | 12/2017 | Peng et al. | |
| 9,881,993 B2 | 1/2018 | Ching et al. | |
| 2016/0365414 A1* | 12/2016 | Peng | H01L 29/7842 |
| 2020/0161430 A1* | 5/2020 | Takeuchi | H01L 29/165 |
| 2020/0219744 A1* | 7/2020 | Kim | H01L 21/67739 |
| 2021/0028059 A1* | 1/2021 | Chan | H01L 23/535 |
| 2021/0343841 A1* | 11/2021 | Shin | H01L 29/0673 |
| 2022/0005927 A1* | 1/2022 | Weeks | H01L 29/665 |

* cited by examiner

GATE-ALL-AROUND DEVICES WITH SUPERLATTICE CHANNEL

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
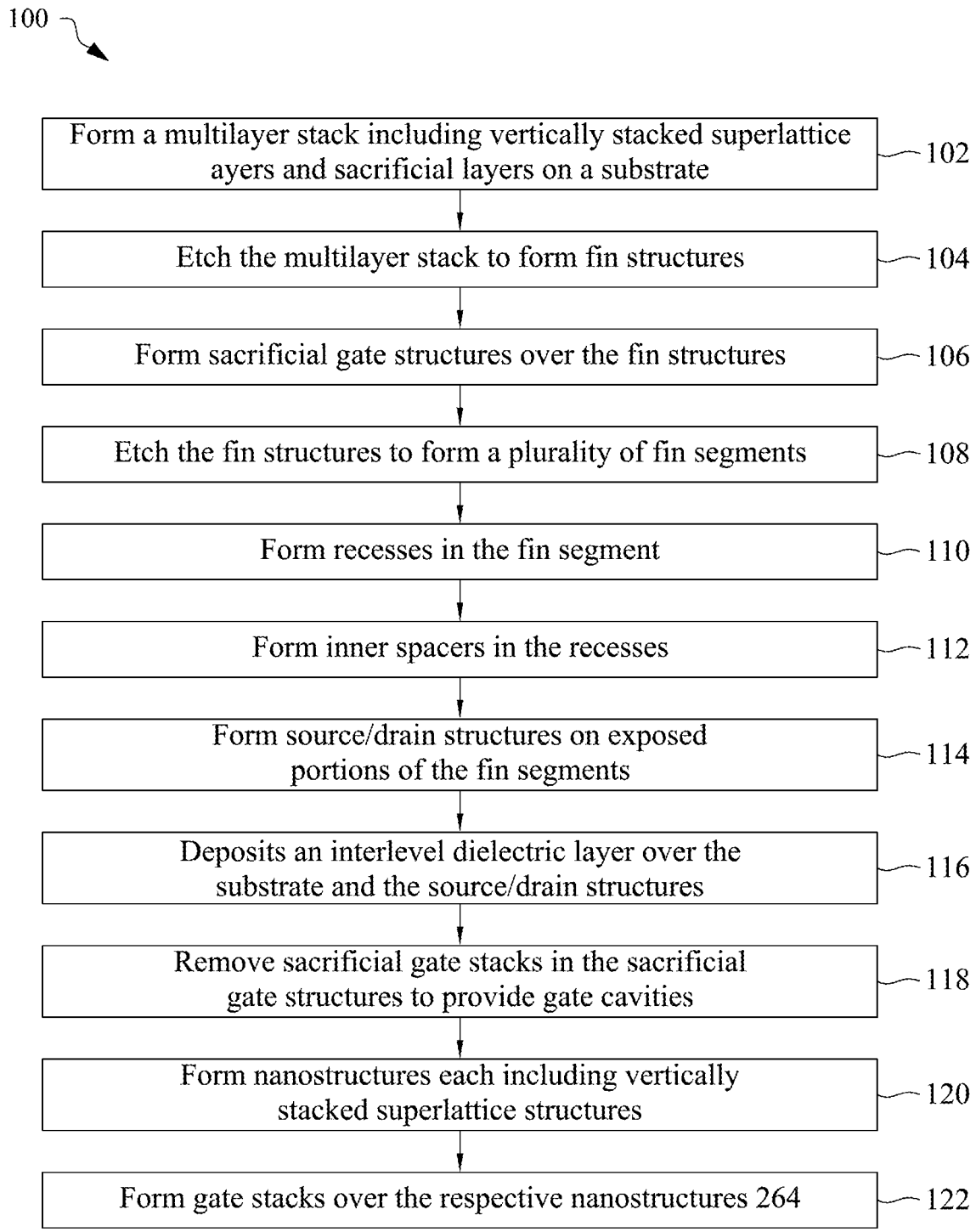
FIG. 1 is a process flow chart illustrating an example method of forming a semiconductor structure having vertically stacked superlattice channels, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the semiconductor industry has progressed into nanometer technology nodes in pursuit of higher device density, higher performance, and lower costs, challenges from both fabrication and design issues have resulted in the development of three-dimensional designs, such as gate-all-around (GAA) field effect transistors (FETs). In GAA FETs, the gate is wrapped all around the channel. By all-around covering of the gate over a channel, better gate control and better short channel performance can be achieved.

However, when a nanosheet of a single semiconductor material, e.g., Ge or SiGe is used as the channel in GAA FETs, the GAA FETs suffer from low carrier mobility and high leakage current due to the presence of large number of surface defects on the nanosheet. In additional, as the channel dimension continuously decreases for better gate control, the nanosheet channel made of Ge or SiGe does not possess sufficient mechanical strength, and is easily broken during the fabrication of the GAA FETs.

In embodiments of the present disclosure, to minimize the surface defects and increase the mechanical strength of the channel, GAA FETs with a superlattice structure as the channel are constructed. The superlattice structure includes alternatively stacked nanosheets of different semiconductor materials, aligned either parallel or perpendicular to the substrate. The thickness of the nanosheets is controlled to reduce the surface defects and increase the mechanical strength of the resulting superlattice structure. The superlattice structure thus helps to improve the carrier mobility and reduce leakage current. As a result, the device performance is increased.

FIG. 1 is a flowchart of a method 100 for fabricating a semiconductor structure 200, in accordance with some embodiments. FIGS. 2A through 2K are cross-sectional views of the semiconductor structure 200 at various stages of the method 100, in accordance with some embodiments. The method 100 is discussed in detail below, with reference to the semiconductor structure 200. The flowchart illustrates only a relevant part of the entire manufacturing process for the semiconductor structure 200. It is understood that additional operations may be provided before, during, and after the operations shown by FIG. 1, and some of the operations described below can be replaced or eliminated for additional embodiments of the method. The order of the operations/processes may be interchangeable.

Figure 2A:
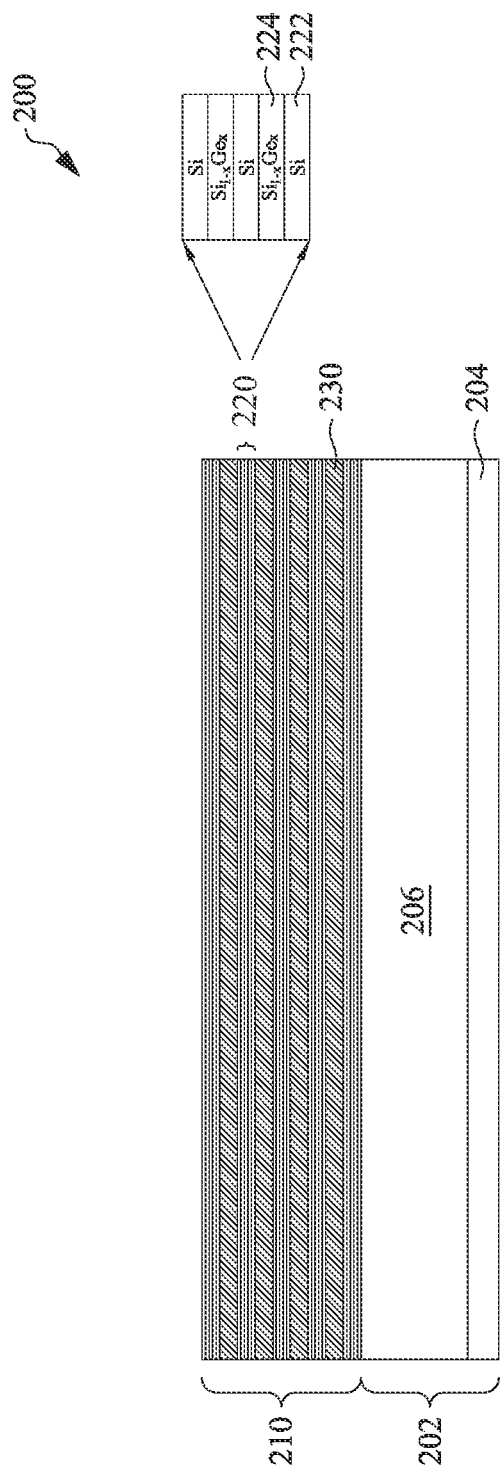
FIGS. 2A-2K are cross-sectional views of a semiconductor structure at various stages of the fabrication process of FIG. 1, in accordance with some embodiments.

At operation 102, the method 100 (FIG. 1) forms a multilayer stack 210 on a substrate 202, in accordance with some embodiments. FIG. 2A is a cross-sectional review of the semiconductor structure 200 after forming the multilayer stack 210 on the substrate 202, in accordance with some embodiments.

Referring to FIG. 2A, the substrate 202 includes a base substrate 204 and an insulator layer 206. The substrate 202 can be formed from a semiconductor-on-insulator (SOI) substrate or a bulk semiconductor substrate including a bulk semiconductor material throughout. In some embodiments, and as shown in FIG. 2A, the substrate 202 is formed from a SOI substrate including, from bottom to top, the base substrate 204, the insulator layer 206 and a top semiconductor layer that constitutes a bottommost layer of the multilayer stack 210. In some other embodiments, and when the substrate 202 is formed from a bulk semiconductor substrate, an upper portion of the bulk semiconductor substrate constitutes the bottommost layer of the multilayer stack 210

The base substrate 204 provides mechanical support to the overlying structures, such as the buried insulator layer 206 and the multilayer stack 210. In some embodiments, the base substrate 204 may include a group IV semiconductor material such as, for example, silicon (Si), germanium (Ge), silicon germanium (SiGe), carbon doped silicon (SiC), silicon germanium carbon (SiGeC); or an III-V compound semiconductor such as, for example, gallium arsenide (GaAs), gallium phosphide (GaP), indium phosphide (InP), indium arsenide (InAs), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP). In some other embodiments, the base substrate 204 includes an insulating material, such as, for example, glass.

The insulator layer 206 is disposed on the base substrate 204. The insulator layer 206 electrically isolated the base substrate 204 and the top semiconductor layer from each other. In some embodiments, the insulator layer 206 includes a dielectric material such as silicon dioxide, silicon nitride, silicon oxynitride, boron nitride, or combinations thereof. In some embodiments, the buried insulator layer 206 is formed by a deposition process, such as chemical vapor deposition (CVD), plasma enhanced chemical vapor deposition (PECVD) or physical vapor deposition (PVD). In some other embodiments, the insulator layer 206 is formed using a thermal growth process, such as thermal oxidation, to convert a surface portion of the base substrate 204. In some further embodiments, the insulator layer 206 is formed by implanting oxygen atoms into a bulk semiconductor substrate and thereafter annealing the bulk semiconductor substrate.

The top semiconductor layer may include any semiconductor material as mentioned above for the base substrate 204. For example, in some embodiments, the top semiconductor layer includes Si, Ge, SiGe, SiC, SiGeC; or an III-V compound semiconductor including GaAs, GaP, InP, InAs, InSb, GaAsP, AlInAs, AlGaAs, GaInAs, GaInP, or GaInASP. In some embodiments, the top semiconductor layer is composed of a single crystalline semiconductor material, such as, for example, single crystalline Si. In some embodiments, the top semiconductor layer is formed by a deposition process, such as CVD or PECVD, or it can represent an uppermost portion of a bulk semiconductor substrate in which oxygen atoms used to form the insulator layer 206 are implanted therein. Alternatively, the top semiconductor layer may initially be formed on a carrier substrate and then bonded to the substrate 202 from the insulator layer 206 side. The top semiconductor layer may be thinned to a desired thickness so as to be employed as the bottommost layer of the multilayer stack 210, for example, by planarization, grinding, etching, or oxidation followed by oxide etch. The top semiconductor layer may be thinned to a thickness ranging from about 1 nm to about 10 nm. In some other embodiments, the thickness of the top semiconductor layer may range from about 3 nm to about 5 nm.

The multilayer stack 210 is disposed on the substrate 202. In some embodiments, the multilayer stack 210 includes a plurality of vertically stacked superlattice layers 220 and sacrificial layers 230 separating the superlattice layers 220 from one another. It should be noted that although five superlattice layers 220 are illustrated, any number of superlattice layers 220 are contemplated.

In some embodiments, each of the superlattice layers 220 includes alternating layers of first layers 222 of a first semiconductor material and second layers 224 of a second semiconductor material. The second semiconductor material is different from the first semiconductor material. The difference materials used in respective first and second layers 222, 224 allow different strains between the first layers 222 and the second layers 224 so as to improve the carrier mobility. In some embodiments, the first layers 222 and the second layer 224 are independently comprised of a group IV semiconductor material, such as Si, Ge, SiGe, SiGeC, SiC, or the like; an III-V compound semiconductor material, such as GaAs, GaP, GaAsP, AlInAs, AlGaAs, GaInAs, InAs, GaInP, InP, InSb, GaInAsP, or the like. In some embodiments, the first layers 222 are comprised of Si, and the second layers 224 are comprised SiGe or Ge. The concentration of Ge in SiGe is adjusted to control carrier mobility and etching selectivity. In some embodiments, the concentration of Ge in SiGe may be from about 1% to about 90% by atomic weight %. In certain embodiments, the concentration of Ge in SiGe may be from about 20% to about 40% by atomic weight %. If the Ge concentration is too high, the SiGe layer likely has a large number of defects, which results in low carrier ability. If the Ge concentration is too low, the SiGe layer likely does not possess sufficient etching selectivity with respect to the sacrificial layer.

Each superlattice layer 220 can include any number of the first layers 222 (e.g., Si layers) and any number of the second layers 224 (e.g., SiGe layers). In some embodiments, and as illustrated in FIG. 2A, the superlattice layer 220 includes three first layers 222 (e.g., Si layers) and two second layers 224 (e.g., SiGe layers).

In some embodiments, the sacrificial layers 230 include a third semiconductor material that is different from the first and second semiconductor materials so that the sacrificial layers 230 can be removed selective to the first and second layers 222, 224. In some embodiments, in instances where the first layers 222 include Si and the second layers 224 include SiGe, the sacrificial layers 230 may include Ge. In some embodiments, in instances where the first layers 222 include Si and the second layers 224 include Ge, the sacrificial layers 230 may include SiGe.

Each of the first layers 222 (e.g., Si layers), the second layers 224 (e.g., SiGe layers), and the sacrificial layers 230 (e.g., Ge layers), in some embodiments, is epitaxially grown on its underlying layer utilizing an epitaxial growth (or deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. Each layer in the multilayer stack 210, thus, has an epitaxial relationship, i.e., same crystal orientation, as that of the underlying semiconductor material layer. Thus, when the top semiconductor layer of the SOI substrate or an upper portion of the bulk semiconductor substrate (i.e., the bottommost first layer 222) is comprised of a single crystalline semiconductor material, each of the first and second layers 222, 224 and the sacrificial layers 230 in the multilayer stack 210 formed thereupon is comprised of a single crystalline semiconductor material. In some embodiments, each of the first and second layers 222, 224 and the sacrificial layers 230 in the multilayer stack 210 may be formed by, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE), or metal-organic CVD (MOCVD). In some embodiments, the epitaxial growth of the various layers 222, 224, 230 in multilayer stack 210 is performed without breaking vacuum between the various depositions. In some embodiments, the vacuum is broken between any of the various depositions. The thickness of each of the first and second layers 222, 224 and the sacrificial layers 230 is controlled to be less than a corresponding critical thickness above which defects occur. A critical thickness for a particular layer in the multilayer stack 210 depends on the material choice for the particular layer and the underlying layer. In some embodiments, each of the first layers 222, the second layers 224, and the sacrificial layers 230 has a thickness ranging from about 1 nm to about 10 nm. If the thickness of each of the first layers 222, the second layers 224, and the sacrificial layers 230 is too great, defects are likely formed in the respective first layers 222, second layers 224, and sacrificial layers 230. If the thickness of each of the first layers 222, the second layers 224, and the sacrificial layers 230 is too small, the respective first layers 222, second layers 224, and the sacrificial layers 230 likely do not possess sufficient mechanical strength for device fabrication. In some embodiments, each of the first layers 222, the second layers 224, and the sacrificial layers 230 has a thickness ranging from about 3 nm to about 5 nm.

Figure 2B:
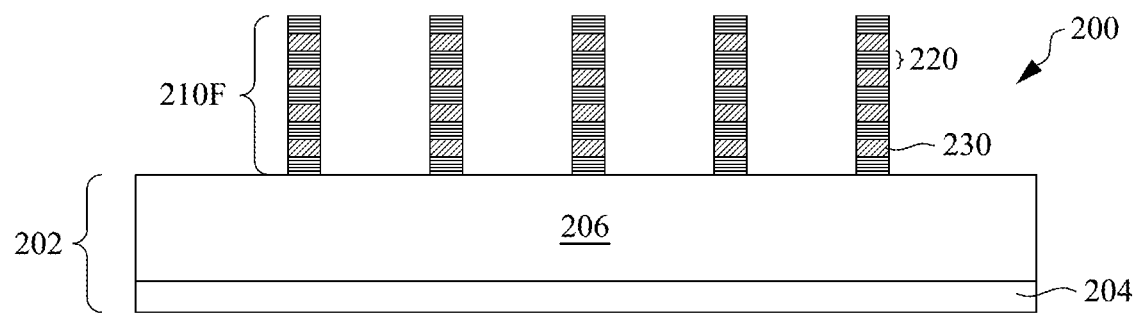

At operation 104, the method 100 (FIG. 1) etches the multilayer stack 210 to form a plurality of fin structures 210F, in accordance with some embodiments. FIG. 2B is a cross-sectional view of the semiconductor structure 200 of FIG. 2A after etching the multilayer stack 210 to form the plurality of fin structures 210F, in accordance with some embodiments.

Referring to FIG. 2B, the fin structures 210F are extended upward from the substrate 202 with the superlattice layers 220 aligned parallel to the substrate 202. It should be noted that although five fin structures 210F are illustrated, any number of fin structures 210F are contemplated in the present disclosure.

The multilayer stack 210 can be etched by any suitable method to provide the fin structures 210F. For example, in some embodiments, the fin structures 210F may be formed by first applying a photoresist layer over the topmost surface of the multilayer stack 210 and lithographically patterning the photoresist layer to provide a patterned photoresist layer that covers areas where the fin structures 210F are to be formed. The multilayer stack 210 is then etched by an anisotropic etch using the patterned photoresist layer as an etch mask. In some embodiments, the anisotropic etch is a dry etch such as, for example reactive ion etch (ME), a wet etch, or a combination thereof. In some embodiments, the etch stops at the surface of the insulator layer 206. In some embodiments, the etch proceeds into the insulator layer 206. After formation of the fin structures 210F, the patterned photoresist layer is removed utilizing a resist stripping process such as, for example, ashing.

The multilayer stack 210 may be patterned using two or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

Alternatively, the multilayer stack 210 may be patterned utilizing a sidewall image transfer (SIT) process. For example, in some embodiments, a sacrificial layer is formed over multilayer stack 210 and patterned using a photolithography process. Spacers are formed alongside the patterned sacrificial layer using a self-aligned process. The sacrificial layer is then removed, and the remaining spacers may then be used to pattern the multilayer stack 210.

Figure 2C:
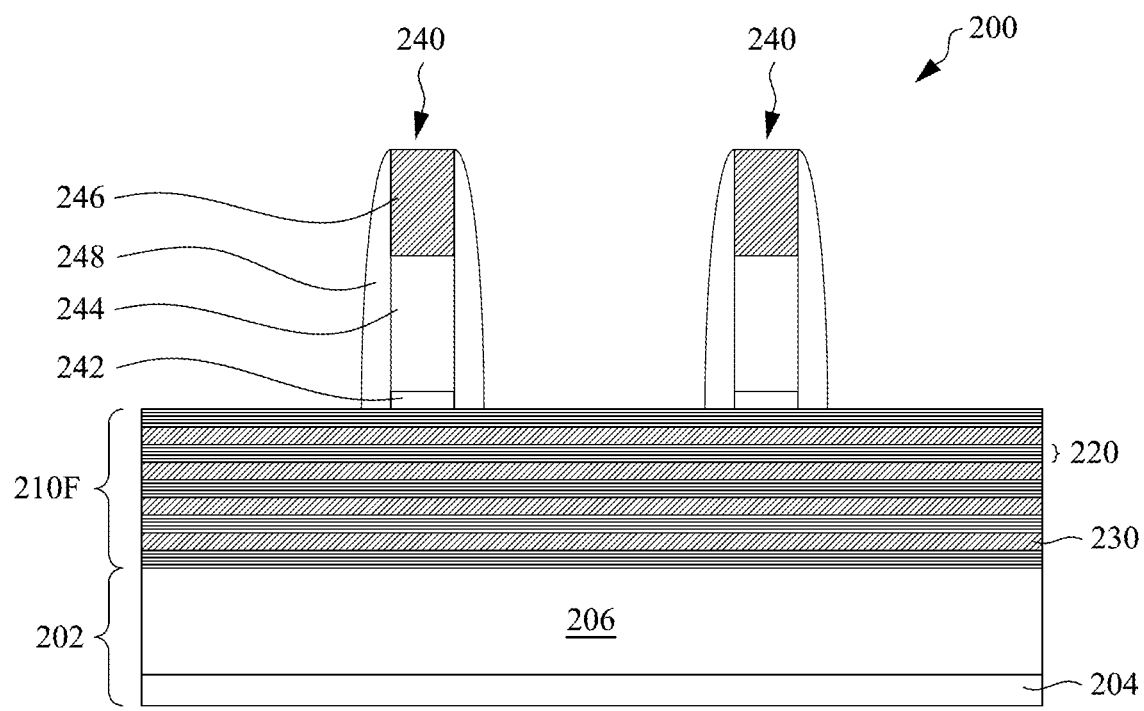

At operation 106, the method 100 (FIG. 1) forms a plurality of sacrificial gate structures 240 over the fin structures 210F, in accordance with some embodiments. FIG. 2C is a cross-sectional view of the semiconductor structure 200 of FIG. 2B after forming the plurality of sacrificial gate structures 240 over the fin structures 210F, in accordance with some embodiments.

Referring to FIG. 2C, each of the sacrificial gate structures 240 includes a sacrificial gate stack (242, 244, 246) straddling a portion of a corresponding fin structure 210F and gate spacers 248 on sidewalls of the sacrificial gate stack (242, 244, 246). By "straddling" it is meant that a sacrificial gate stack is formed atop and along sidewalls of the fin structure. The term "sacrificial gate stack" as used herein refers to a placeholder structure for a subsequently formed gate stack used to control output current (i.e., flow of carriers in the channel) of a semiconducting device through electrical fields or magnetic fields. It should be noted that although two sacrificial gate structures are illustrated, any number of sacrificial gate structures are contemplated in the present disclosure.

Each of the sacrificial gate stacks (242, 244, 246) include, from bottom to top, a sacrificial gate dielectric 242, a sacrificial gate conductor 244, and a sacrificial gate cap 246. In some embodiments, the sacrificial gate dielectric 242 is omitted. In some embodiments, the sacrificial gate stacks (242, 244, 246) are formed by first providing a sacrificial material stack (not shown) that includes, from bottom to top, a sacrificial gate dielectric layer if the sacrificial gate dielectric 242 is present, a sacrificial gate conductor layer and a sacrificial gate cap layer, over the fin structures 210F and the substrate 202, and by subsequently patterning the sacrificial material stack.

If present, in some embodiments, the sacrificial gate dielectric layer includes silicon oxide, silicon nitride, or silicon oxynitride. In some embodiments, the sacrificial gate dielectric layer is formed utilizing a deposition process such as, for example, CVD or PVD. In some embodiments, the sacrificial gate dielectric layer is formed by conversion of a surface portion of the fin structures 210F utilizing thermal oxidation or nitridation.

In some embodiments, the sacrificial gate conductor layer includes polysilicon. In some embodiments, the sacrificial gate conductor layer is formed utilizing a deposition process such as, for example, CVD or PECVD.

In some embodiments, the sacrificial gate cap layer includes a dielectric material such as an oxide, a nitride, or an oxynitride. For example, in some embodiments, the sacrificial gate cap layer includes silicon nitride. In some embodiments, the sacrificial gate cap layer is formed utilizing a deposition process such as, for example, CVD or PECVD.

In some embodiments, the sacrificial gate material stack is patterned by lithography and etching. For example, a photoresist layer (not shown) is applied over the topmost surface of the sacrificial material stack and lithographically patterned by lithographic exposure and development. The pattern in the photoresist layer is sequentially transferred into the sacrificial material stack by at least one anisotropic etch. The anisotropic etch is a dry etch, for example RIE, a wet etch, or a combination thereof. If not completely consumed, the remaining photoresist layer after formation of the sacrificial gate stacks (242, 244, 246) is removed by, for example, ashing.

In some embodiments, the gate spacers 248 include a dielectric material such as, for example, an oxide, a nitride, an oxynitride, or combinations thereof. In some embodiments, the gate spacers 248 comprise silicon nitride. In some embodiments, the gate spacers 248 are formed by first depositing a conformal gate spacer material layer (not shown) on exposed surfaces of the sacrificial gate stack (242, 244, 246), the fin structures 210F and the substrate 202 and then etching the gate spacer material layer to remove horizontal portions of the gate spacer material layer. In some embodiments, the gate spacer material layer is deposited, for example, by CVD, PECVD, or atomic layer deposition (ALD). In some embodiments, the gate spacer material layer is etched by dry etch such as, for example, RIE. Vertical portions of the gate spacer material layer present on the sidewalls of sacrificial gate stacks (242, 244, 246) constitute the gate spacers 248.

Figure 2D:
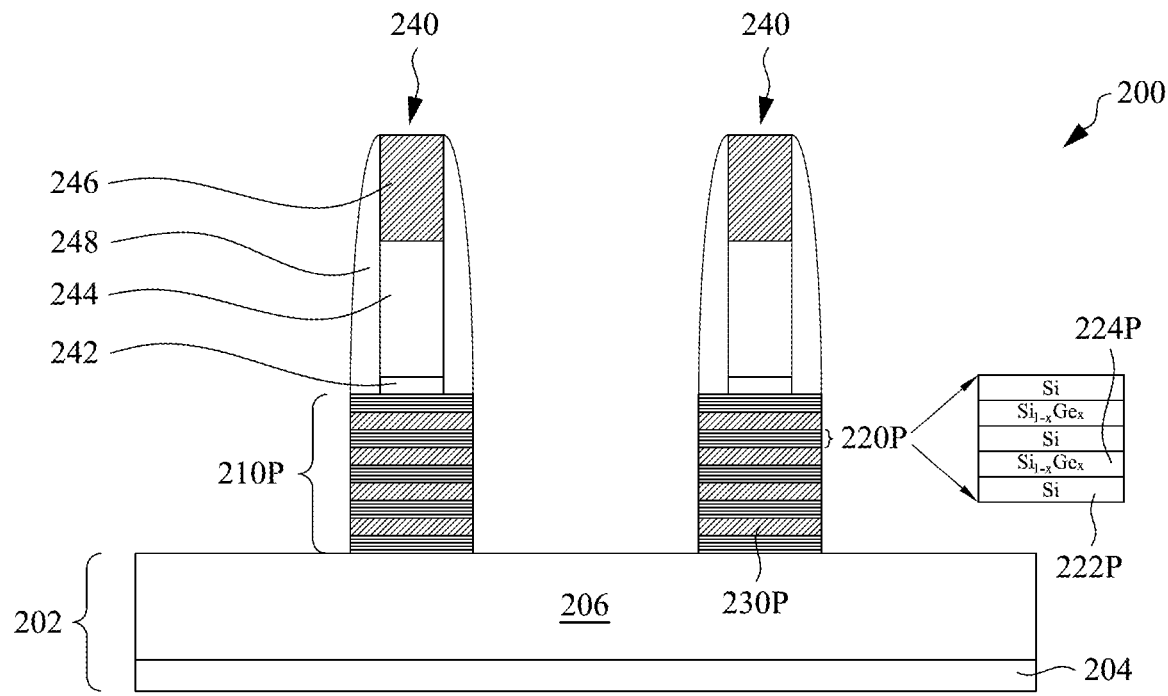

At operation 108, the method 100 (FIG. 1) etches the fin structures 210F to form a plurality of fin segments 210P, in accordance with some embodiments. FIG. 2D is a cross-sectional view of the semiconductor structure 200 of FIG. 2C after forming the plurality of fin segments 210P, in accordance with some embodiments.

Referring to FIG. 2D, portions of the fin structures 210F that are not covered by the sacrificial gate structures 240 are removed to provide fin segments 210P beneath the sacrificial gate structures 240. Each of the fin segments 210P includes alternatively stacked superlattice structures 220P which are remaining portions of the superlattice layer 220 and sacrificial structures 230P which are remaining portions of the sacrificial layer 230 in a corresponding fin structure 210F after etching. Each of the superlattice structures 220P includes alternating first nanosheets 222P which are remaining portions of the first layers 222 and second nanosheets which are remaining portions of the second layers 224 after etching.

In some embodiments, the portions of the fin structures 210F that are exposed by the sacrificial gate structures 240 are removed using an anisotropic etch that etches the semiconductor materials providing the respective first and second layers 222, 224 and the material providing the sacrificial layer 230 without substantially affecting the surrounding structures, including the substrate 202, the sacrificial gate cap 246, and the gate spacers 248. In some embodiments, the anisotropic etch is a dry etch, such as RIE. After the etching, sidewalls of the fin segments 210P, i.e., sidewalls of the superlattice structures 220P and the sacrificial structures 230P, are substantially aligned with sidewalls of the sacrificial gate structures 240, i.e., sidewalls of the gate spacers 248.

Figure 2E:
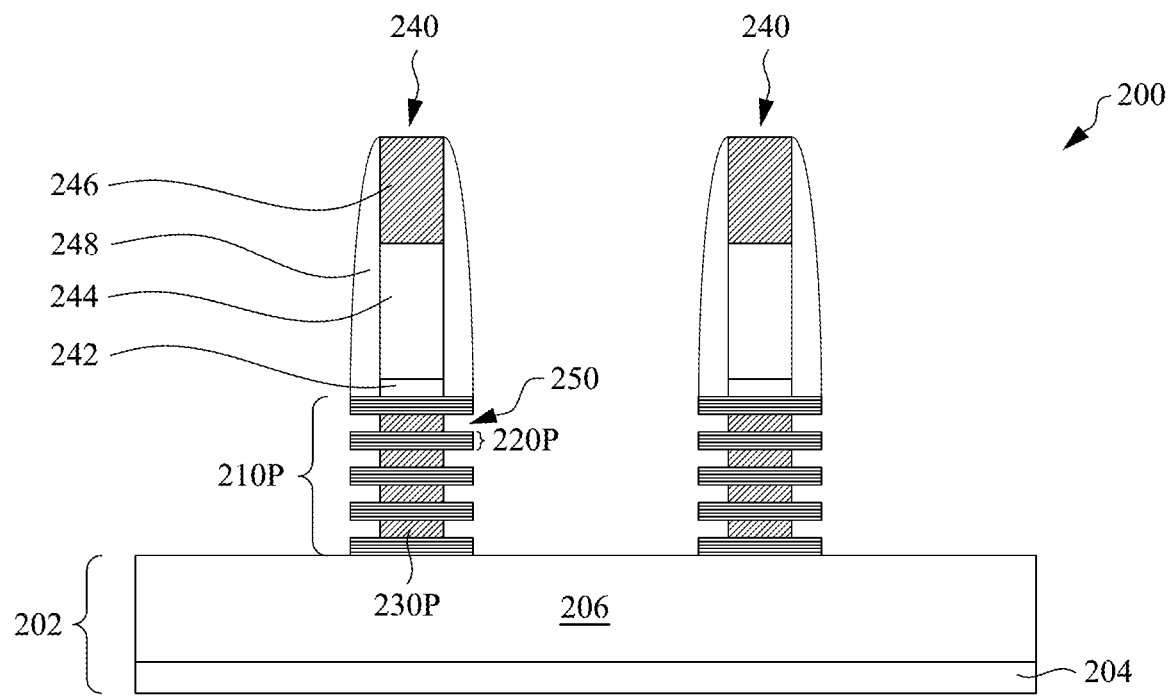

At operation 110, the method 100 (FIG. 1) forms recesses 250 in the fin segments 210P. FIG. 2E is a cross-sectional view of the semiconductor structure 200 of FIG. 2D after forming the recesses 250 in the fin segments 210P, in accordance with some embodiments.

Referring to FIG. 2E, end portions of each of the sacrificial structures 230P in the fin segments 210P underneath the gate spacers 248 are etched, for example, by a lateral etch to form the recesses 250. The lateral etch selectively removes the third semiconductor material providing the sacrificial structures 230P relative to semiconductor materials providing the respective first and second nanosheets 222P, 224P in the superlattice structures 220P, and dielectric materials providing the substrate 202, the sacrificial gate caps 246, and the gate spacers 248. In some embodiments, an isotropic etch, such as a wet etch, is performed. In some embodiments, hydrogen peroxide, i.e., $H_2O_2$ is used to selectively undercut the sacrificial structures 230P. The lateral etch is controlled such that the lateral dimension of the recesses 250 is no greater than the width of the gate spacers 248.

Figure 2F:
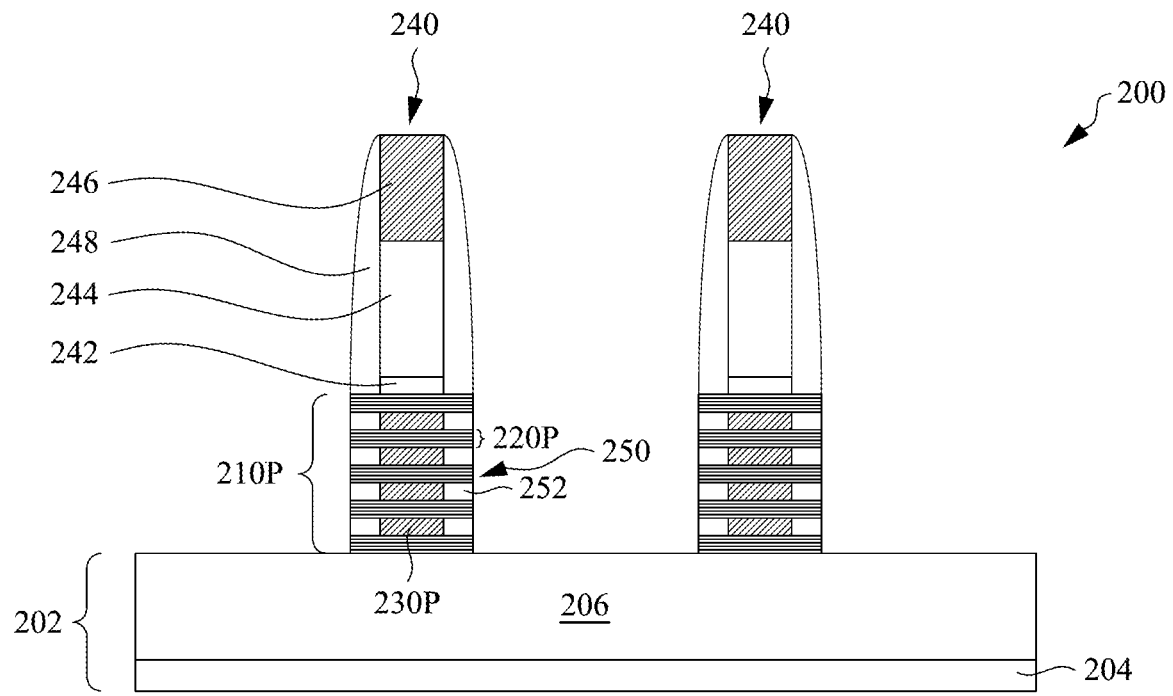

At operation 112, the method 100 (FIG. 1) forms inner spacers 252 in the recesses 250. FIG. 2F is a cross-sectional view of the semiconductor structure 200 of FIG. 2E after forming inner spacers 252 in the recesses 250, in accordance with some embodiments.

Referring to FIG. 2F, the inner spacers 252 are formed to fill the recesses 250. Each of the inner spacers 252 has an outer sidewall that is vertically aligned with an outer sidewall of a corresponding gate spacer 248. In some embodiments, the inner spacers 252 include a dielectric material such as, for example, silicon nitride, silicon carbon nitride, or the silicon oxynitride.

The inner spacers 252 can be formed by depositing an inner spacer layer on exposed surfaces of the semiconductor structure 200 using a suitable conformal deposition method such as, for example, CVD or ALD. The conformal deposition process is continued until the recesses 250 are filled and pinched off by the inner spacer layer. An etching process, such as an anisotropic etch, is performed to remove portions of the inner spacer layer disposed outside the recesses 250 in the fin segments 210P. The anisotropic etch can be a dry etch such as RIE or a wet etch. The remaining portions of the inner spacer layer (e.g., portions disposed inside the recesses 250 in the fin segments 210P) form the inner spacers 252.

Figure 2G:
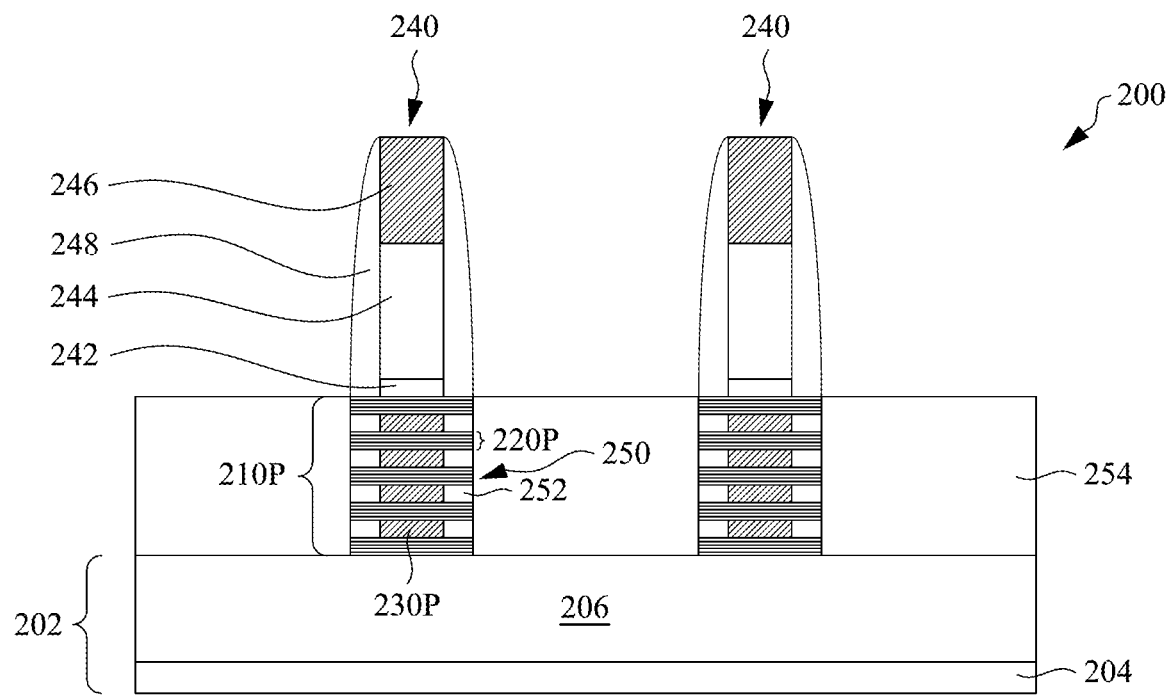

At operation 114, the method 100 (FIG. 1) forms source/drain structures 254 on exposed portions of the fin segments 210P. FIG. 2G is a cross-sectional view of the semiconductor structure 200 of FIG. 2F after forming the source/drain structures 254 on the exposed portions of the fin segments 210P, in accordance with some embodiments.

Referring to FIG. 2G, the source/drain structures 254 are formed on opposite sides of the sacrificial gate structure 240. The source/drain structures 254 are highly doped semiconductor regions. In some embodiments, the source/drain structures 254 have a dopant concentration from about $1\times10^{19}$ atoms/cm$^3$ to about $1\times10^{22}$ atoms/cm$^3$, although lesser or greater dopant concentrations are also contemplated.

The source/drain structures 254 allow for the source/drain structures 254 to exert stress in the FET channel. The materials used for the source/drain structures 254 may be varied for the n-type and p-type FETs, such that one type of material is used for the n-type FETs to exert a tensile stress in the channel and another type of material for the p-type FETs to exert a compressive stress in the channel. For example, SiP or SiC may be used to form n-type FETs, and SiGe or Ge may be used to form p-type FETs. However, any suitable material may be used. For p-type FETs, the source/drain structures 254 are doped with p-type dopants, while for n-type FETs, the source/drain structures 254 are doped with n-type dopants. Examples of p-type dopants include, but are not limited to, boron (B), aluminum (Al), gallium (Ga), or indium (In). Examples of n-type dopants include, but are not limited to, phosphorous (P), arsenic (As), or antimony (Sb). In some embodiments, the source/drain structures 254 include phosphorous doped SiC for n-type FETs. In some embodiments, the source/drain structures 254 include boron doped SiGe for p-type FETs.

In some embodiments, the source/drain structures 254 can be formed by epitaxially growing a semiconductor material from exposed semiconductor surfaces such as surfaces of the first and second nanosheets 222P, 224P in the superlattice structures 220P, but not from the dielectric surfaces such as surfaces of the insulator layer 206, the sacrificial gate caps 246, gate spacers 248, and the inner spacers 252. In some embodiments, when multiple fin segments 210P are present, the epitaxial growth process continues until the deposited semiconductor material merges adjacent fin segments 210P.

The semiconductor material providing the source/drain structures 254 can be deposited as an intrinsic semiconductor material, or can be deposited with in-situ doping. If the semiconductor material is deposited as an intrinsic semiconductor material, the source/drain structures 254 can be subsequently doped (ex-situ) utilizing ion implantation, gas phase doping or dopant out diffusion from a sacrificial dopant source material.

In some embodiments, the source/drain structures 254 may be further exposed to an annealing process to activate the dopants in the source/drain structures 254 after forming the source/drain structures 254 and/or after the subsequent doping process. In some embodiments, the dopants in the source/drain structures 254 are activated by a thermal annealing process including a rapid thermal annealing process, a laser annealing process, or a furnace annealing process.

Figure 2H:
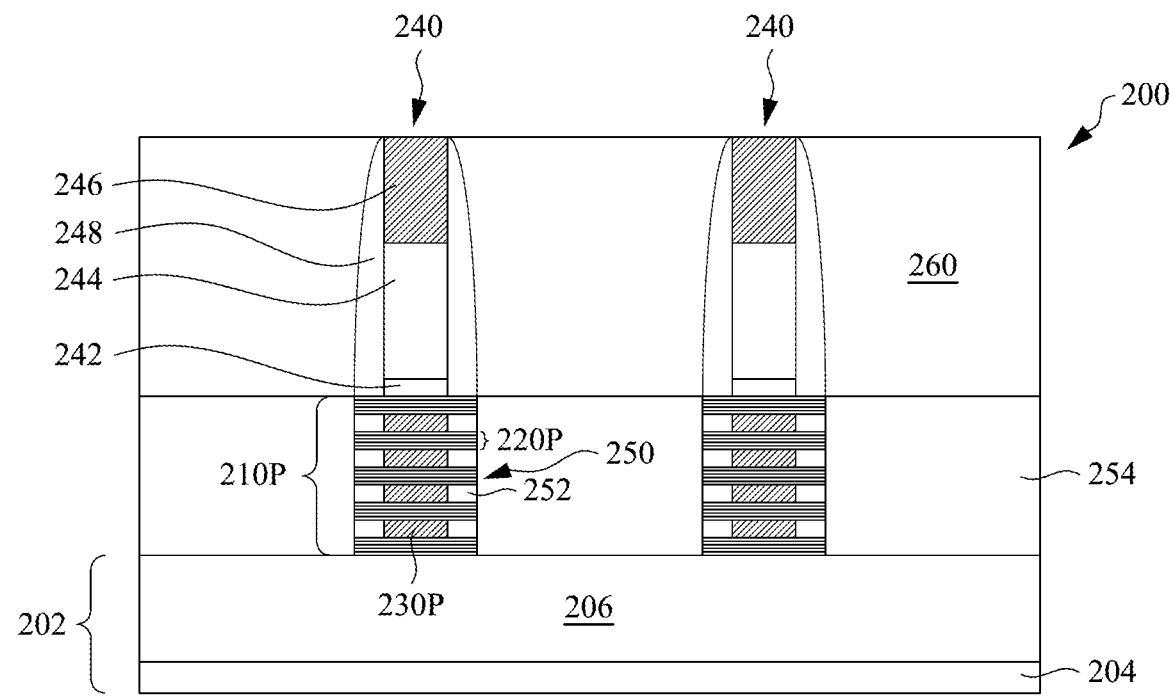

At operation 116, the method 100 (FIG. 1) deposits an interlevel dielectric (ILD) layer 260 over the substrate 202 and the source/drain structures 254, in accordance with some embodiments. FIG. 2H is a cross-sectional view of the semiconductor structure 200 of FIG. 2G after depositing the ILD layer 260 over the substrate 202 and the source/drain structures 254, in accordance with some embodiments.

Referring to FIG. 2H, the ILD layer 260 is deposited to fill the spaces between the sacrificial gate structures 240. In some embodiments, the ILD layer 260 includes silicon oxide. Alternatively, in some embodiments, the ILD layer 260 includes a low-k dielectric material having a dielectric constant (k) less than 4. In some embodiments, the low-k dielectric material has a dielectric constant from about 1.2 to about 3.5. In some embodiments, the ILD layer 260 includes silicon oxide formed from tetraethylorthosilicate (TEOS) oxide, undoped silicate glass, or doped silicate glass such as borophosphosilicate glass (BPSG), fluorosilica glass (FSG), phosphosilicate glass (PSG), boron doped silicon glass (BSG), and/or other suitable dielectric materials. In some embodiments, the ILD layer 260 is deposited by CVD, PECVD, PVD, or spin coating. In some embodiments, the ILD layer 260 is deposited to have a top surface above the topmost surfaces of the sacrificial gate structures 240 (e.g., the top surfaces of the sacrificial gate caps 246). The ILD layer 260 is subsequently planarized, for example, by CMP and/or a recess etch using the sacrificial gate caps 246 as a polishing and/or etch stop. After the planarization, the ILD layer 260 has a top surface substantially coplanar with the topmost surfaces of the sacrificial gate structures 240.

Figure 2I:
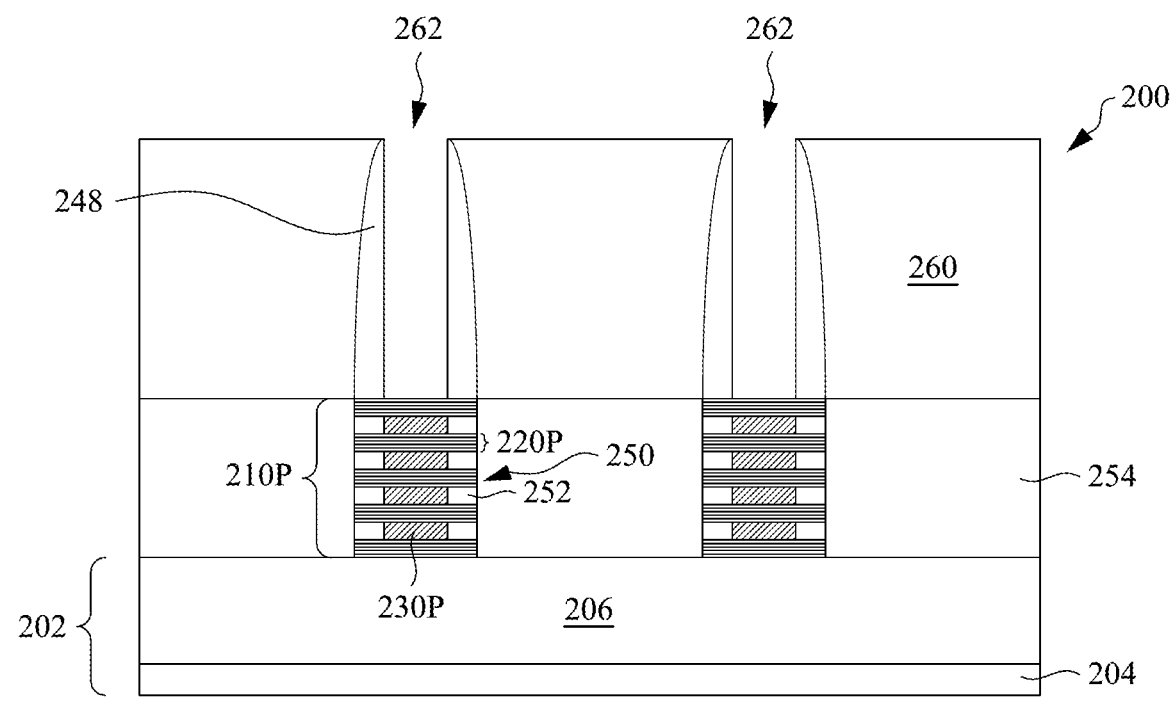

At operation 118, the method 100 (FIG. 1) removes the sacrificial gate stacks (242, 244, 246) to provide gate cavities 262, in accordance with some embodiments. FIG. 2I is a cross-sectional view of the semiconductor structure 200 of FIG. 2H, after removing the sacrificial gate stacks (242, 244, 246) to provide gate cavities 262, in accordance with some embodiments.

Referring to FIG. 2I, various components of the sacrificial gate stack (242, 244, 246) are removed selectively to the semiconductor materials that provide the respective first and second nanosheets 222P, 224P of the superlattice structures 220P and the sacrificial structures 230P, and the dielectric materials that provide the respective gate spacers 248, inner spacers 252, and the ILD layer 260 by at least one etch. In some embodiments, the at least one etch is a dry etch such as RIE, a wet etch such as an ammonia etch, or a combination thereof. Each gate cavity 262 occupies a volume from which the corresponding sacrificial gate stack (242, 244, 246) is removed and is laterally confined by inner sidewalls of the corresponding gate spacers 248. After removal of the sacrificial gate stacks (242, 244, 246), sidewalls of various components in the fin segments 210P including the superlattice structures 220P and the sacrificial structures 230P are physically exposed by the gate cavities 262.

Figure 2J:
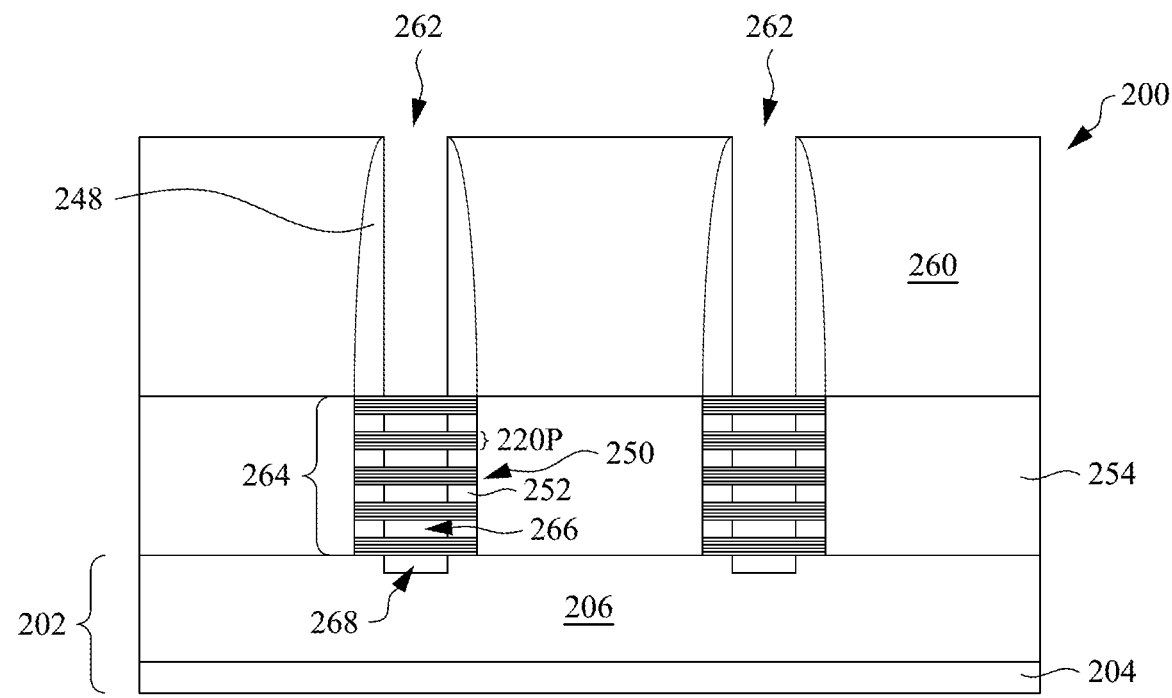

At operation 120, the method 100 (FIG. 1) forms a plurality of nanostructures 264 each including a plurality of vertically stacked superlattice structures 220P, in accordance with some embodiments. FIG. 2J is a cross-sectional view of the semiconductor structure 200 of FIG. 2I after forming the plurality of nanostructures 264 each including the plurality of vertically stacked superlattice structures 220P, in accordance with some embodiments.

Referring to FIG. 2J, the nanostructures 264 can be formed by removing the sacrificial structures 230P in the fin segments 210P. In some embodiments, the sacrificial structures 230P are removed by an etching process. In some embodiments, the etch is an isotropic etch that removes the sacrificial structures 230P selective to the superlattice structures 220P. The removal of the sacrificial structures 230P forms gaps 266 between the superlattice structures 220P. Each of the gaps 266 occupies a volume from which a corresponding sacrificial structure 230P is removed and is laterally confined by the corresponding inner spacers 252. Within each nanostructure 264, the vertically stacked superlattice structures 220P are spaced from each other by corresponding gaps 266.

Subsequently, another etching process is performed to etch portions of the insulator layer 206. The etching process forms recesses 268 such that the bottommost superlattice structures 220P in the nanostructures 264 can be suspended over the substrate 202. In some embodiments, the etching process is an isotropic etch which can be a dry etch such as RIE or a wet etch. The etch removes the insulator layer 206, without substantially affecting the superlattice structures 220P.

Figure 2K:
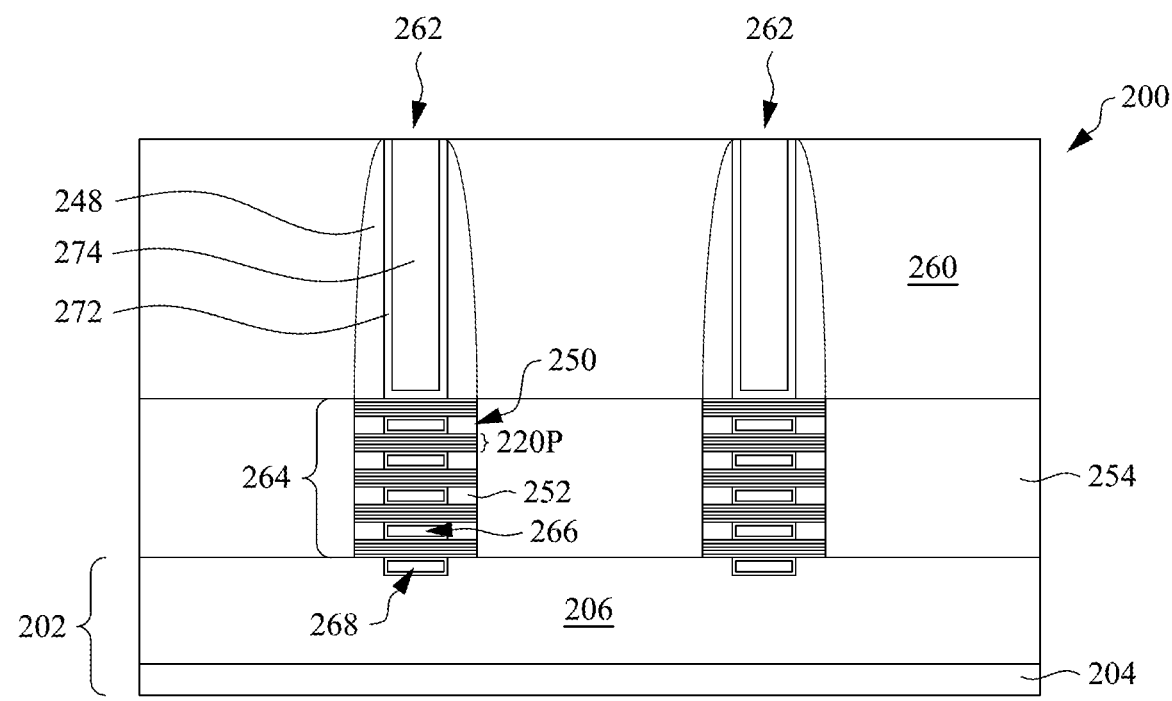

At operation 122, the method 100 (FIG. 1) forms a plurality of gate stacks (272, 274) over the respective nanostructures 264. FIG. 2K is a cross-sectional view of the semiconductor structure 200 of FIG. 2J after forming the plurality of gate stacks (272, 274) over the respective nanostructures 264, in accordance with some embodiments.

Referring to FIG. 2K, each of the gate stacks (272, 274) is formed within a corresponding gate cavity 262, gaps 266 between adjacent superlattice structures 220P in a corresponding nanostructure 264, and the recess 268 between the bottommost superlattice structure 220P and the substrate 202. Each of the gate stacks (272, 274) wraps around the vertically stacked superlattice structures 220P in the corresponding nanostructure 264, thereby forming a gate all around (GAA) FET. In some embodiments, each of the gate stacks (272, 274) includes a gate dielectric 272 over exposed surfaces of the superlattice structures 220P in the corresponding nanostructure 264 and a gate electrode 274 over the gate dielectric 272. The gate stacks (272, 274) and the corresponding gate spacers 248 laterally surrounding the gate stack (272, 274) together define a gate structure (272, 274, 248).

Each of the gate stacks (272, 274) includes a first portion within the corresponding gate cavity 262 and a second portion within the corresponding gaps 266 and recess 268. In the gate cavity 262, the gate dielectric 272 is U-shaped having a horizontal portion in direct contact with an upper surface of the topmost superlattice structure 220P in a corresponding nanostructure 264 and vertical portions that are located on exposed sidewalls of the gate spacers 248 laterally surrounding the gate cavity 262. Within the gaps 266 and recess 268, the gate dielectric 272 surrounds the gate electrode 274.

In some embodiments, the gate dielectric 272 includes a high-k dielectric material having a dielectric constant greater than silicon oxide. Exemplary high-k dielectric materials include, but are not limited to, hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum Aluminum oxide ($LaAlO_3$), and yttrium oxide ($Y_2O_3$). In some embodiments, a multilayered gate dielectric structure comprising different gate dielectric materials, e.g., silicon oxide, and a high-k gate dielectric is formed. In some embodiments, the gate electrode 274 includes a conductive metal such as, for example, tungsten (W), copper (Cu), aluminum (Al), cobalt (Co), or alloys thereof.

To form the gate stacks (272, 274), a gate dielectric layer is deposited over exposed surfaces of the ILD layer 260, the gate cavities 262, the gaps 266, and the recesses 268. In some embodiments, the gate dielectric layer is deposited by a suitable conformal deposition process such as CVD or ALD. A conductive material layer is then deposited over the gate dielectric layer to fill the gate cavities 262, the gaps 266, and the recesses 268. In some embodiments, the conductive material layer is deposited by CVD, PECVD, or PVD. A planarization process, such as CMP is performed to remove portions of the conductive material layer and the gate dielectric layer from the top surface of the dielectric layer. The remaining portions of the conductive material layer within the gate cavities 262, the gaps 266, and the recesses 268 constitutes the gate electrodes 274, and the remaining portions of the gate dielectric layer within the gate cavities 262, the gaps 266, and the recesses 268 constitutes the gate dielectrics 272.

GAA FETs are thus formed. Each of the GAA FETs includes a plurality of vertically stacked and vertically spaced superlattice structures 220P, a gate stack (272, 274) that wraps around the plurality of vertically stacked and vertically spaced superlattice structures 220P, and source/drain structures on opposite sides of the gate stack. Each of the plurality of vertically stacked and vertically spaced superlattice structures 220P includes alternating first nanosheets 222P of a first semiconductor material and second nanosheets 224P of a second semiconductor material that is different from the first semiconductor material. Comparing to using a nanosheet of a single semiconductor material as the channel of a GAA FET, using a superlattice structure comprising nanosheets of different semiconductor materials as the channel in a GAA FET helps to improve carrier mobility and reduce leakage current due to the reduced surface defects in the superlattice structure. As a result, the device performance is increased.

Vertical GAA FETs that include multiple vertically aligned semiconductor nanostructures (e.g., nanosheets) serving as the channels have been developed to enable a large effective conductive width in a small layout area overlying a substrate. A typical vertical GAA FET enables enhanced control of the charge carriers along the lengthwise direction of a semiconductor nanostructure through a complete encirclement of the channel region of the semiconductor nanostructure by a gate dielectric and a gate electrode. The vertical GAA FET has a reduced short channel effect because the channel region is surrounded by the gate electrode so that an effect of the source/drain structures on an electric field of the channel region may be reduced. In embodiments of the present disclosure, vertical FETs with vertically aligned superlattice structures as the FETs channels are formed to further increase the device performance.

Figure 3:
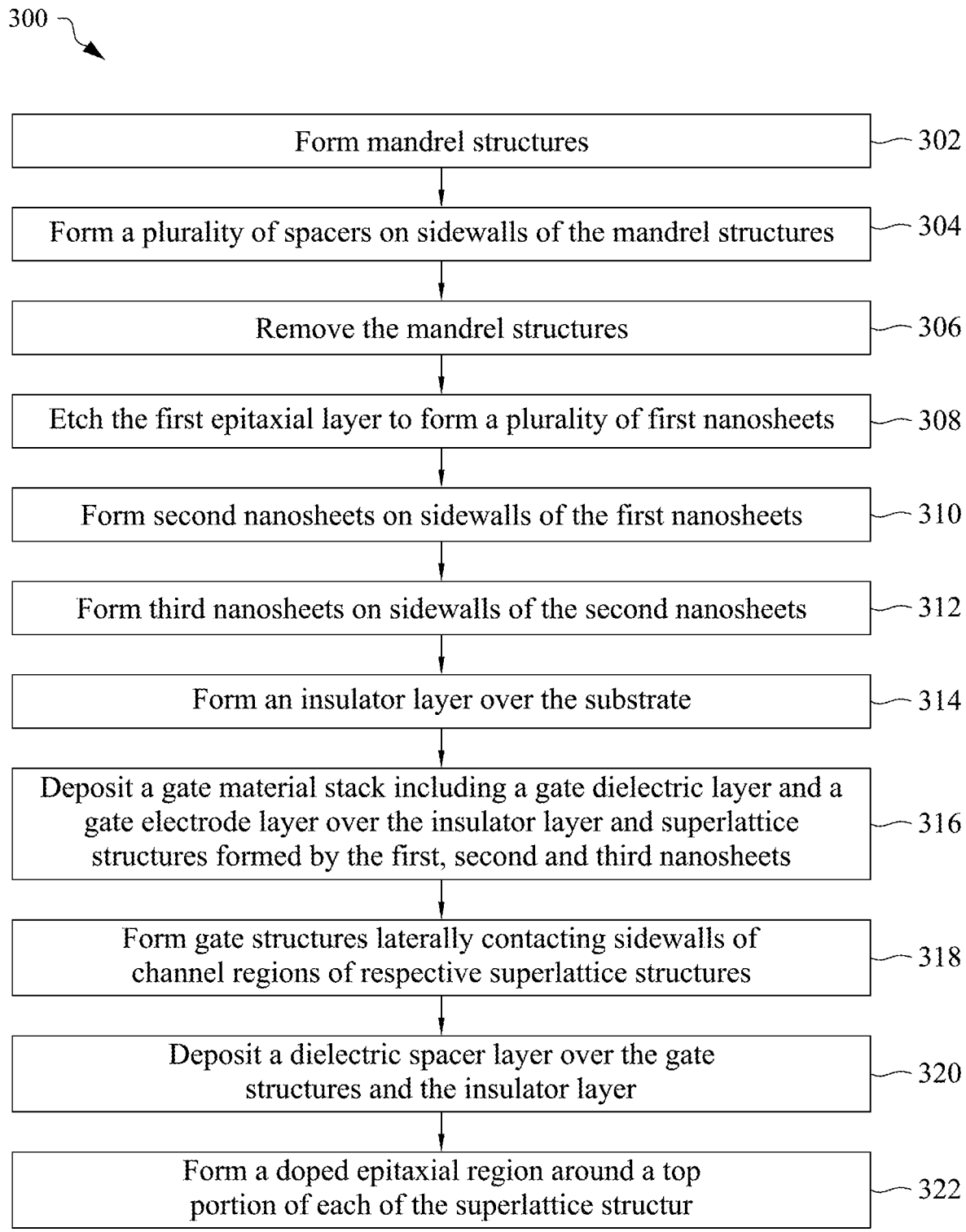
FIG. 3 is a process flow chart illustrating an example method of forming a semiconductor structure having lateral superlattice channels, in accordance with some embodiments.

FIG. 3 is a flowchart of a method 300 for fabricating a semiconductor structure 400, in accordance with some embodiments. FIGS. 4A through 4K are cross-sectional views of the semiconductor structure 400 at various stages of the method 300, in accordance with some embodiments. The method 300 is discussed in detail below, with reference to the semiconductor structure 400. The flowchart illustrates only a relevant part of the entire manufacturing process for the semiconductor structure 400. It is understood that additional operations may be provided before, during, and after the operations shown by FIG. 3, and some of the operations described below can be replaced or eliminated for additional embodiments of the method. The order of the operations/processes may be interchangeable.

Figure 4A:
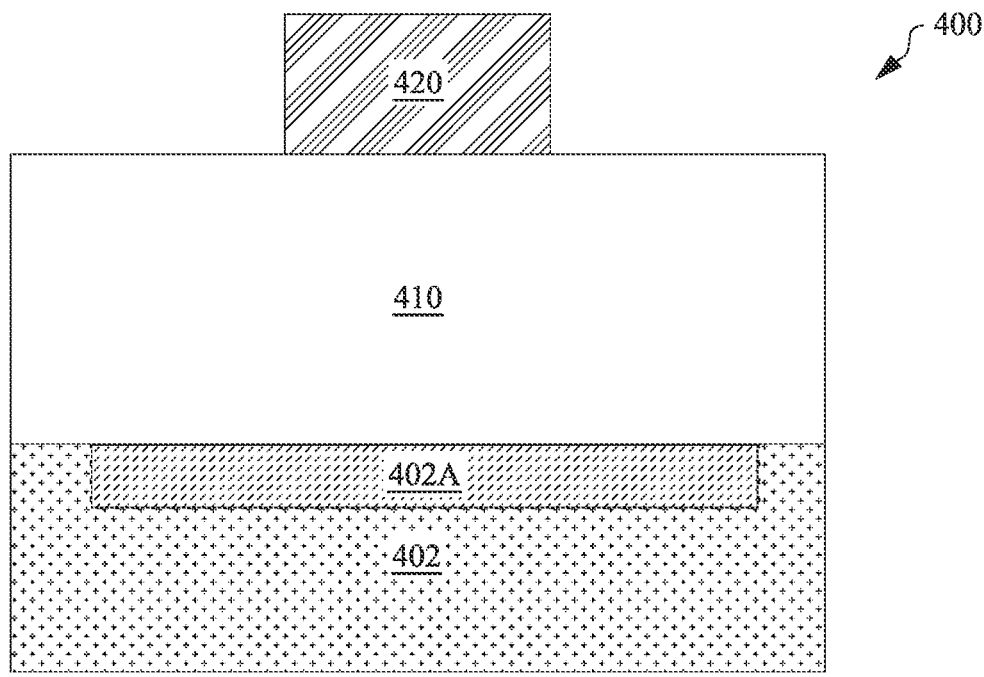
FIGS. 4A-4K are cross-sectional views of a semiconductor structure at various stages of the fabrication process of FIG. 3, in accordance with some embodiments.

At operation 302, the method 300 (FIG. 3) forms a plurality of mandrel structures 420 over a first epitaxial layer 410, in accordance with some embodiments. FIG. 4A is a cross-sectional review of the semiconductor structure 400 after forming the plurality of mandrel structures 420 over the first epitaxial layer 410, in accordance with some embodiments.

Referring to FIG. 4A, a substrate 402 is provided. In some embodiments, the substrate 402 is a bulk semiconductor substrate. In some embodiments, the bulk semiconductor substrate includes a semiconductor material or a stack of semiconductor materials such as, for example, Si, Ge, SiGe, SiC, SiGeC; or an III-V compound semiconductor such as, for example, GaAs, GaP, InP, InAs, InSb, GaAsP, AlInAs, AlGaAs, GaInAs, GaInP, or GaInAsP. In some embodiments, the bulk semiconductor substrate includes a single crystalline semiconductor material such as, for example, single crystalline Si. In some embodiments, the bulk semiconductor substrate is doped depending on design requirements. In some embodiments, an upper portion of the bulk semiconductor substrate is doped with p-type dopants or n-type dopants to form a doped semiconductor region 402A. Exemplary p-type dopants include, but are not limited to, B, Al, Ga, and In. Exemplary n-type dopants include, but are not limited to, P, As, and Sb. The doped semiconductor region 402A has a low resistivity (i.e., heavily doped) having a dopant concentration in a range from $1.0 \times 10^{19}$ atoms/cm$^3$ to $1.0 \times 10^{22}$ atoms/cm$^3$, although the dopant concentrations may be greater or smaller. In some embodiments, the doped semiconductor region 402A serves as a bottom source/drain structure for vertical FETs subsequently formed.

In some embodiments, the substrate 402 is a top semiconductor layer of an SOI substrate. The top semiconductor layer includes the above-mentioned semiconductor material such as, for example, Si, Ge, SiGe, SiC, SiGeC; or an III-V compound semiconductor including GaAs, GaP, InP, InAs, InSb, GaAsP, AlInAs, AlGaAs, GaInAs, GaInP, or GaInASP.

The first epitaxial layer 410 is disposed on the substrate 402. The first epitaxial layer 410 may include any semiconductor material as mentioned above for the substrate 402. In some embodiments, the first epitaxial layer 410 includes a same semiconductor material as the semiconductor material that provides the substrate 402. For example, both the first epitaxial layer 410 and the substrate 402 may be composed of Si. In some other embodiments, the first epitaxial layer 410 includes a different semiconductor material than the semiconductor material that provides the substrate 402. For example, in some embodiments, the first epitaxial layer 410 is composed of SiGe or Ge, while the substrate 402 is composed of Si.

The first epitaxial layer 410 is formed to have a high resistivity of at least 100 Ω·cm. In some embodiments, the first epitaxial layer 410 is intrinsic (i.e., undoped). In other embodiments, the first epitaxial layer 410 may be lightly doped with n-type or p-type dopants and having a dopant concentration in a range from $1.0 \times 10^{12}$ atoms/cm$^3$ to $1.0 \times 10^{14}$ atoms/cm$^3$. The high resistivity helps to decrease parasitic capacitance, allowing the devices to be more closely packed upon the substrate 402.

The first epitaxial layer 410 is formed by an epitaxial growth process such as, for example, MBE or MOCVD. The first epitaxial layer 410 thus has a same crystalline orientation as that of the underlying substrate 402. If doped, the dopants can be introduced as the semiconductor material that provides the first epitaxial layer 410 is being deposited, i.e., during the epitaxial growth process. Alternatively, in some embodiments, the dopants can be introduced into the first epitaxial layer 410 after the epitaxial growth process, for example, by ion implantation.

The mandrel structures 420 are disposed over the first epitaxial layer 410. It should be noted that any numbers of mandrel structures 420 are contemplated in the present disclosure. For simplicity, only a single mandrel structure 420 is illustrated and described. The mandrel structures 420 may include any material (e.g., semiconductor, dielectric or conductive material) that can be selectively removed relative to the first epitaxial layer 410. In some embodiments, the mandrel structures 420 include amorphous Si, polysilicon, amorphous or polycrystalline Ge, amorphous or polycrystalline SiGe, amorphous carbon, diamond-like carbon, or organosilicate glass.

In some embodiments, the mandrel structures 420 are formed by first depositing a mandrel layer on the first epitaxial layer 410 using a deposition process such as, for example, CVD or PECVD. Subsequently, the mandrel layer is patterned by lithography and etching. The patterning of the mandrel layer is performed, for example, by applying a photoresist layer above the mandrel layer, lithographically patterning the photoresist layer, and transferring the pattern in the photoresist layer into the mandrel layer by an anisotropic etch. The anisotropic etch can be a dry etch such as RIE or a wet etch. The remaining portions of the mandrel layer after the lithographic patterning constitute the mandrel structures 420. After formation of the mandrel structures 420, the patterned photoresist layer is removed, for example, by ashing.

Figure 4B:
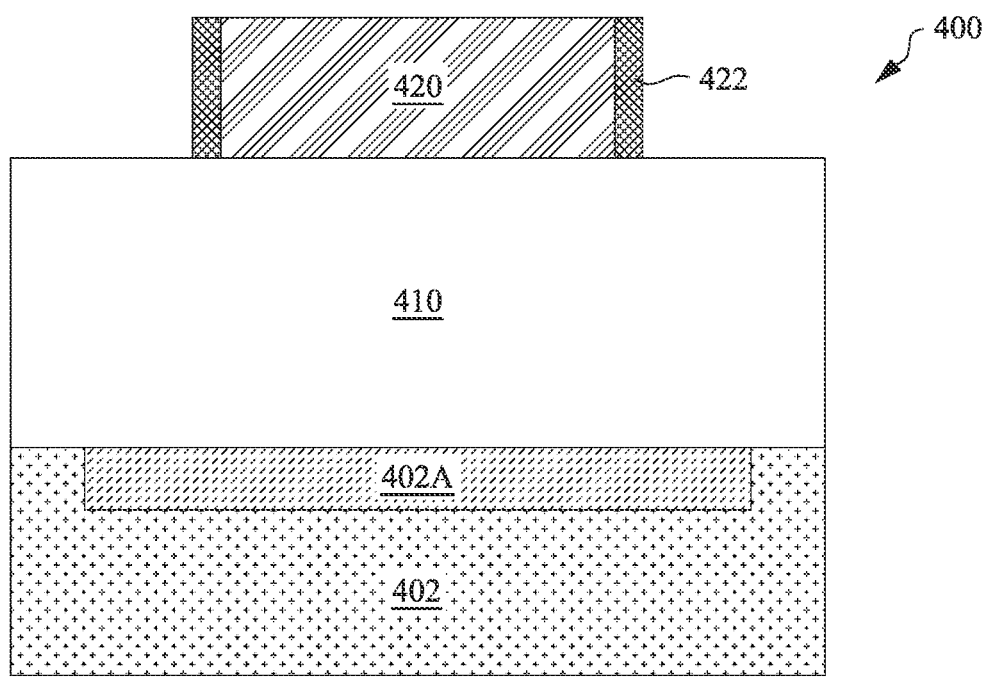

At operation 304, the method 300 (FIG. 3) forms a plurality of spacers 422 on sidewalls of the mandrel structures 420, in accordance with some embodiments. FIG. 4B is a cross-sectional review of the semiconductor structure 400 of FIG. 4A after forming the plurality of spacers 422 on the sidewalls of the mandrel structures 420, in accordance with some embodiments.

Referring to FIG. 4B, the spacers 422 may include any material that has a different etching selectivity than that of the mandrel structures 420, so that the mandrel structures 420 can be selectively removed with respect to the spacers 422. In some embodiments, the spacers 422 include a dielectric oxide such as silicon oxide or a dielectric nitride such as silicon nitride. In some embodiments, the spacers 422 are formed by conformally depositing a spacer layer over the mandrel structures 420 and the first epitaxial layer 410, followed by removing horizontal portions of the spacer layer. In some embodiments, an anisotropic etch which can be a dry etch such as RIE or a wet etch is performed to remove the horizontal portions of the spacer layer. Remaining vertical portions of the spacer layer present on the sidewalls of the mandrel structures 420 constitute the spacers 422.

Figure 4C:
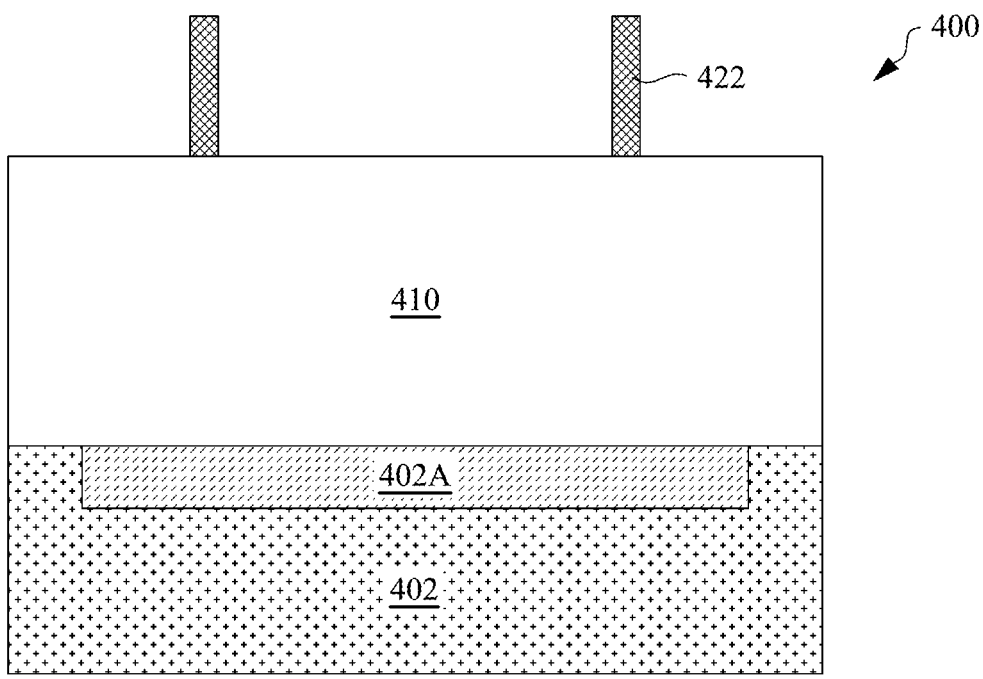

At operation 306, the method 300 (FIG. 3) removes the mandrel structures 420, in accordance with some embodiments. FIG. 4C is a cross-sectional review of the semiconductor structure 400 of FIG. 4B after removing the mandrel structures 420, in accordance with some embodiments.

Referring to FIG. 4C, the mandrel structures 420 are removed selective to the spacers 422 and the first epitaxial layer 410 by an etch. The etch can be a dry etch such as, for example, RIE or a wet etch. In some embodiments, a hydrofluoric acid (HF) based etchant such as, for example, buffered hydrofluoric acid is used to remove the mandrel structures 420, without etching the spacers 422 and the first epitaxial layer 410.

Figure 4D:
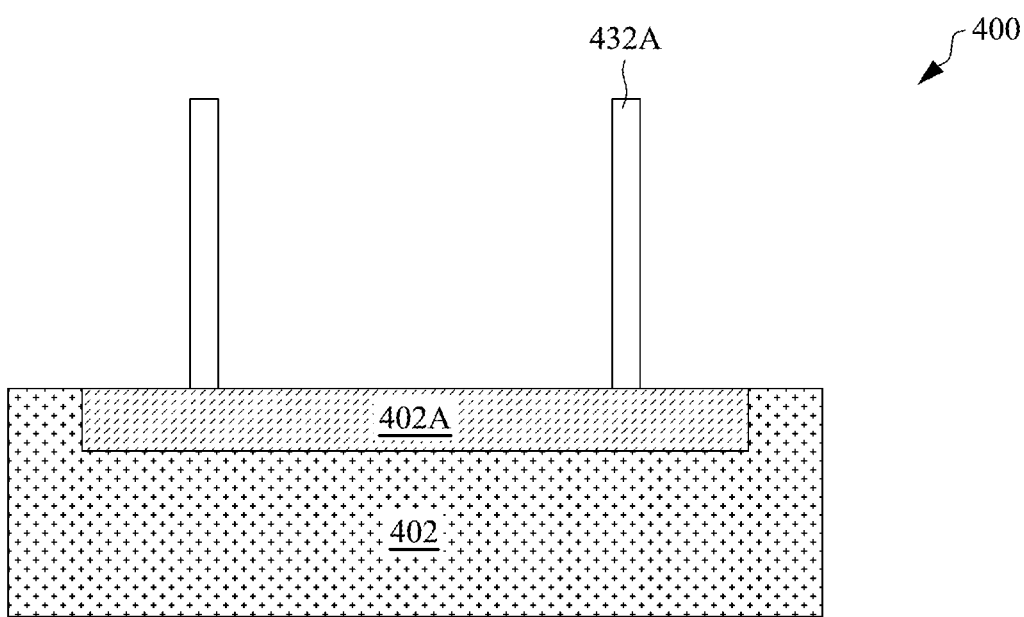

At operation 308, the method 300 (FIG. 3) etches the first epitaxial layer 410 to form a plurality of first nanosheets 432A, in accordance with some embodiments. FIG. 4D is a cross-sectional review of the semiconductor structure 400 of FIG. 4C after etching the first epitaxial layer 410 to form the plurality of first nanosheets 432A, in accordance with some embodiments.

Referring to FIG. 4D, the first epitaxial layer 410 is etched using the spacers 422 as an etch mask. In some embodiments, an anisotropic etch is performed to remove portions of the first epitaxial layer 410 that are not covered by the spacers 422. In some embodiments, the anisotropic etch is a dry etch such as RIE or a wet etch. The remaining portions of the first epitaxial layer 410 constitute the first nanosheets 432A. The thickness of each of the first nanosheets 432A is controlled to be less than the critical thickness to minimize the defect formation in an epitaxial layer subsequently formed thereon. In some embodiments, each of the first nanosheets 432A has a thickness ranging from about 1 nm to about 10 nm. If the thickness of the first nanosheets 432A is too great, defects are likely formed in the epitaxial layer subsequently formed thereon. If the thickness of the first nanosheets 432A is too small, the respective first nanosheets 432A likely do not possess sufficient mechanical strength for device fabrication. In some embodiments, each of the first nanosheets 432A has a thickness ranging from about 3 nm to about 5 nm.

Figure 4E:
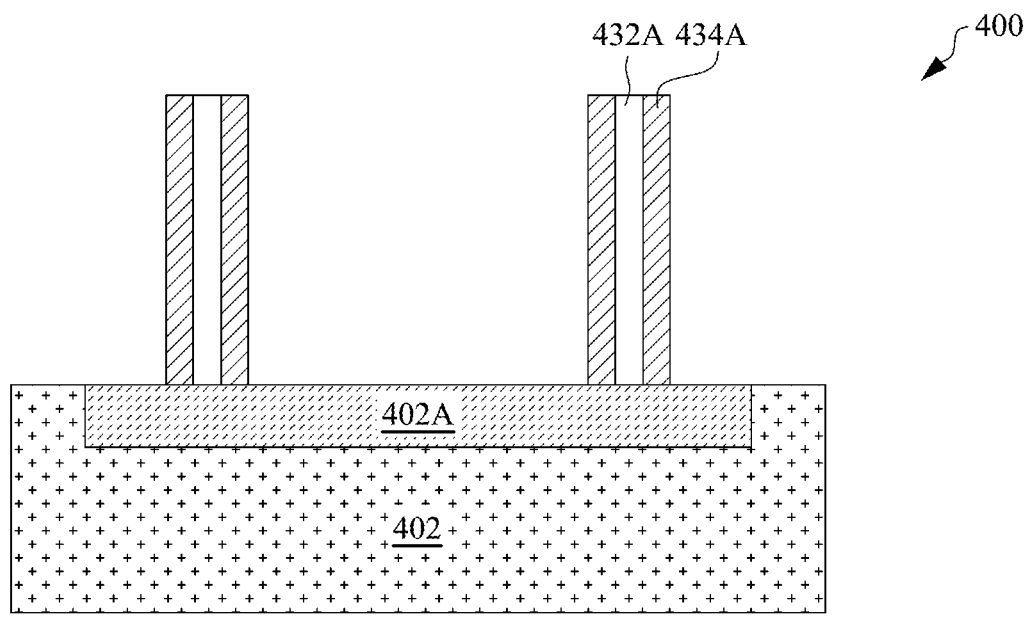

At operation 310, the method 300 (FIG. 3) forms a plurality of second nanosheets 434A on sidewalls of the first nanosheets 432A, in accordance with some embodiments. FIG. 4E is a cross-sectional review of the semiconductor structure 400 of FIG. 4D after forming the plurality of second nanosheets 434A on sidewalls of the first nanosheets 432A, in accordance with some embodiments.

Referring to FIG. 4E, the second nanosheets 434A include a different semiconductor material than the first nanosheets 432A. In some embodiments, the second nanosheets 434A include a group IV semiconductor material, such as Si, Ge, SiGe, SiGeC, SiC, or the like; an III-V compound semiconductor material, such as GaAs, GaP, GaAsP, AlInAs, AlGaAs, GaInAs, InAs, GaInP, InP, InSb, GaInAsP, or the like. In some embodiments and when the first nanosheets 432A are comprised of Si, the second nanosheets 434A are comprised of SiGe or Ge.

In some embodiments, the second nanosheets 434A are formed by epitaxially growing a second epitaxial layer on exposed surfaces of the substrate 402 and the first nanosheets 432A. In some embodiments, the second epitaxial layer is deposited by a conformal deposition process such as, for example, CVD, ALD, or MBE. The thickness of the second epitaxial layer is controlled to be less than a corresponding critical thickness above which defects occurs. In some embodiments, the second epitaxial layer has a thickness ranging from about 1 nm to about 10 nm. If the thickness of the second epitaxial layer is too great, defects are likely formed in the second epitaxial layer. If the thickness of the second epitaxial layer is too small, the resulting second nanosheets 434A likely do not possess sufficient mechanical strength for device fabrication. In some embodiments, the second epitaxial layer has a thickness ranging from about 3 nm to about 5 nm. Subsequently horizontal portions of the second epitaxial layer that are located on the top surfaces of the substrate 402 and the first nanosheets 432A are removed, for example, by an anisotropic etch. The anisotropic etch can be a dry etch such as RIE or a wet etch. Vertical portions of the second epitaxial layer that remain on the sidewalls of the first nanosheets 432A constitute the second nanosheets 434A.

In some embodiments, the epitaxially growing of the second epitaxial layer is continued until the second epitaxial layer fills the spaces between the first nanosheets 432A. After performing a CMP process to planarize the second epitaxial layer such that the top surface of the second epitaxial layer is coplanar with the top surfaces of the first nanosheets 432A, the second epitaxial layer is etched to provide the second nanosheets 434A.

Figure 4F:
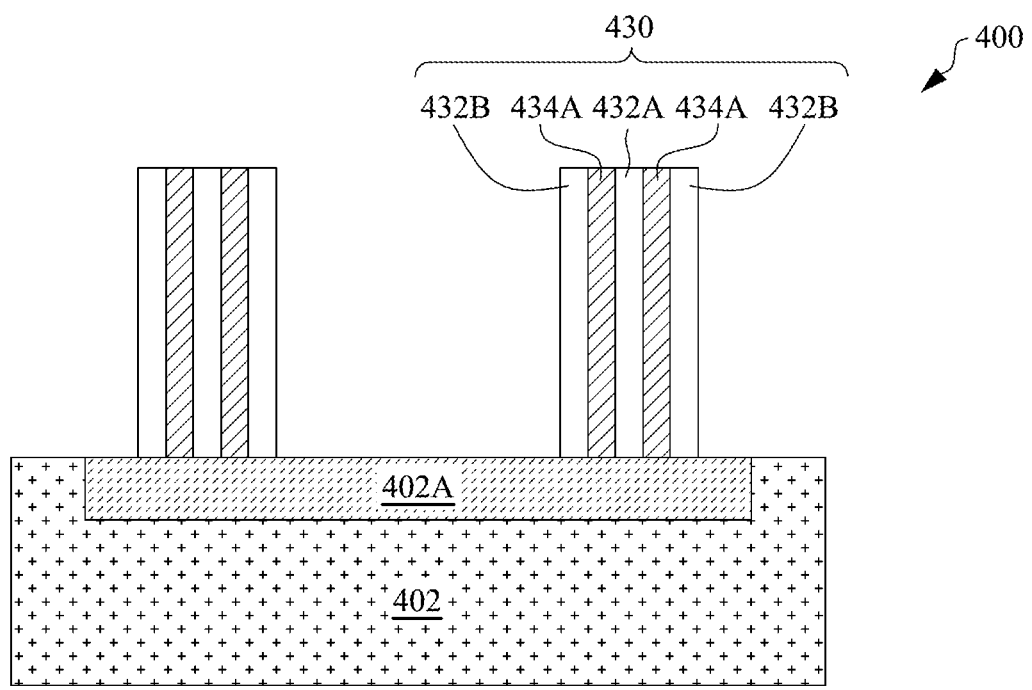

At operation 312, the method 300 (FIG. 3) forms a plurality of third nanosheets 432B on sidewalls of the second nanosheets 434A, in accordance with some embodiments. FIG. 4F is a cross-sectional review of the semiconductor structure 400 of FIG. 4E after forming the plurality of the third nanosheets 432B on the sidewalls of the second nanosheets 434A, in accordance with some embodiments.

Referring to FIG. 4F, the third nanosheets 432B are adapted to form superlattice structures with corresponding first and second nanosheets 432A, 434A. Accordingly, the third nanosheets 432B include a same semiconductor material as the first nanosheets 432A. For example, in some embodiments, both the first nanosheets 432A and the third nanosheets 432B include Si.

In some embodiments, the third nanosheets 432B are formed by epitaxially growing a third epitaxial layer on exposed surfaces of the substrate 402, the first nanosheets 432A, and the second nanosheets 434A. In some embodiments, the third epitaxial layer is deposited by a conformal deposition process such as, for example, CVD, ALD, or MBE. The thickness of the third epitaxial layer is controlled to be less than a corresponding critical thickness above which defects occurs. In some embodiments, the third epitaxial layer has a thickness ranging from about 1 nm to about 10 nm. If the thickness of the third epitaxial layer is too great, defects are likely formed in the third epitaxial layer. If the thickness of the third epitaxial layer is too small, the resulting third nanosheets 432B likely do not possess sufficient mechanical strength for device fabrication. In some embodiments, the third epitaxial layer has a thickness ranging from about 3 nm to about 5 nm. Subsequently, horizontal portions of the third epitaxial layer that are located on the top surfaces of the substrate 402, the first nanosheets 432A, and the second nanosheets 434A are removed, for example, by an anisotropic etch. The anisotropic etch can be a dry etch such as RIE or a wet etch. Vertical portions of the third epitaxial layer that remain on the sidewalls of the second nanosheets 434A constitute the third nanosheets 432B.

In some embodiments, the epitaxially growing of the third epitaxial layer is continued until the third epitaxial layer fills the spaces between the second nanosheets 434A. After performing a CMP process to planarize the third epitaxial layer such that the top surface of the third epitaxial layer is coplanar with the top surfaces of the first and second nanosheets 432A, 434A, the third epitaxial layer is etched to provide the third nanosheets 432B.

A plurality of superlattice structures 430 extending upward from the substrate 402 is thus formed. In some embodiments, each of the superlattice structures 430 includes three nanosheets of a first semiconductor material (i.e., one first nanosheet 432A and a pair of third nanosheets 432B) and two nanosheets of a second semiconductor material (i.e., a pair of second nanosheets 434A) stacked in a lateral direction. The nanosheets of the second semiconductor material 434A separate the nanosheets of first semiconductor material 432A, 432B from each other. It should be noted that operations 310 and 312 that form respective second and third nanosheets 434A, 432B can be repeated to form nanosheets of the first semiconductor material and nanosheets of the second semiconductor material in an alternative configuration. Accordingly, the superlattice structure 430 can be formed with any number of alternating nanosheets of the first semiconductor material and nanosheets of the second semiconductor material stacked in a lateral direction.

Figure 4G:
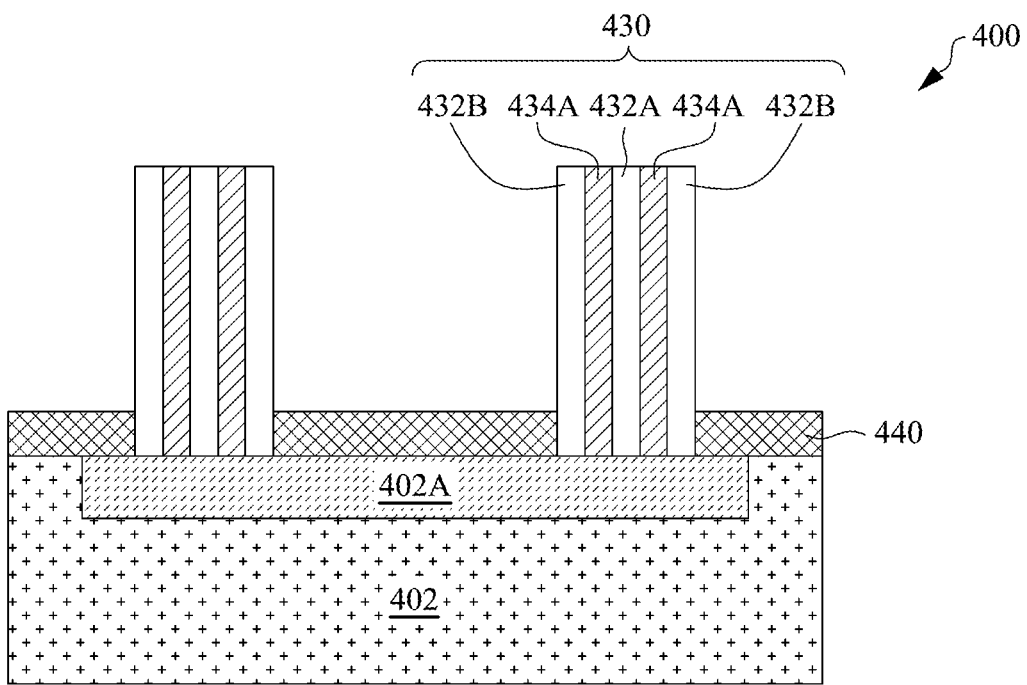

At operation 314, the method 300 (FIG. 3) forms an insulator layer 440 over the substrate 402, in accordance with some embodiments. FIG. 4G is a cross-sectional review of the semiconductor structure 400 of FIG. 4F after forming the insulator layer 440 over the substrate 402, in accordance with some embodiments.

Referring to FIG. 4G, the insulator layer 440 is formed to surround a bottom portion of each of the superlattice structures 430. In some embodiments, the insulator layer 440 includes a dielectric material such as, for example, silicon nitride, SiOCN, or SiBCN. In some embodiments, the insulator layer 440 is formed by depositing a dielectric material over and between the superlattice structures 430 using a deposition process such as, for example, CVD or PVD, planarizing the deposited dielectric material by a planarization technique such as, for example, CMP, and etching back the deposited dielectric material. An anisotropic etch such as, for example, RIE may be employed to etch back the dielectric material of the insulator layer 440 selective to the semiconductor materials of superlattice structures 430.

At operation 316, the method 300 (FIG. 3) deposits a gate material stack over the insulator layer 440 and the superlattice structures 430, in accordance with some embodiments.

Figure 4H:
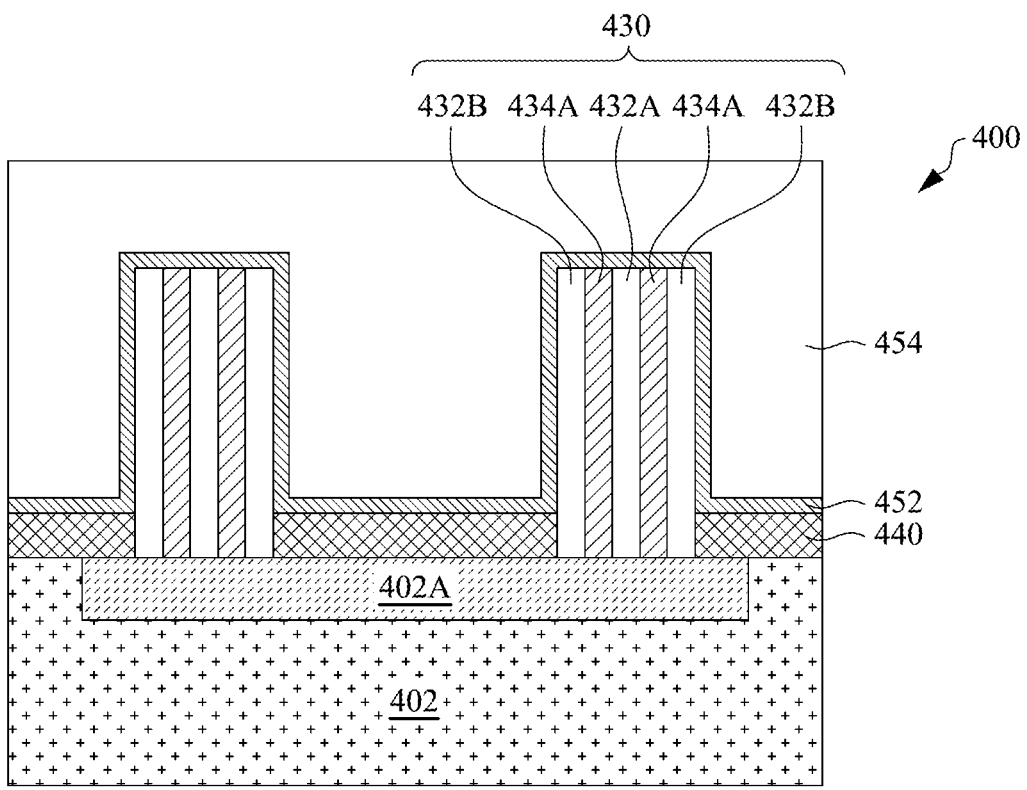

FIG. 4H is a cross-sectional review of the semiconductor structure 400 of FIG. 4G after depositing the gate material stack over the insulator layer 440 and the superlattice structures 430, in accordance with some embodiments.

Referring to FIG. 4H, the gate material stack includes a gate dielectric layer 452 deposited on exposed surfaces of the insulator layer 440 and the superlattice structures 430, and a gate electrode layer 454 deposited on the gate dielectric layer 452. The gate electrode layer 454 fills spaces between the superlattice structures 430.

In some embodiments, the gate dielectric layer 452 includes a high-k dielectric material such as, for example, $HfO_2$, $ZrO_2$, $La_2O_3$, $Al_2O_3$, $TiO_2$, $SrTiO_3$, $LaAlO_3$, or $Y_2O_3$. In some embodiments, the gate dielectric layer 452 may have a multilayer structure comprising different gate dielectric materials, e.g., silicon dioxide, and a high-k gate dielectric material. In some embodiments, the gate dielectric layer 452 is formed utilizing a conformal deposition process such as, for example, CVD or ALD.

The gate electrode layer 454 may comprise any conductive metal. In some embodiments, the gate electrode layer 454 includes W, Cu, Al, Co, or alloys thereof. In some embodiments, the gate electrode layer 454 is formed utilizing a deposition process including, for example, CVD, PECVD, or PVD.

In some embodiments, before depositing the gate electrode layer 454, an optional work function metal layer including TiN or TaN may be formed on the gate dielectric layer 452 to tune the work function of the resulting gate structures.

Figure 4I:
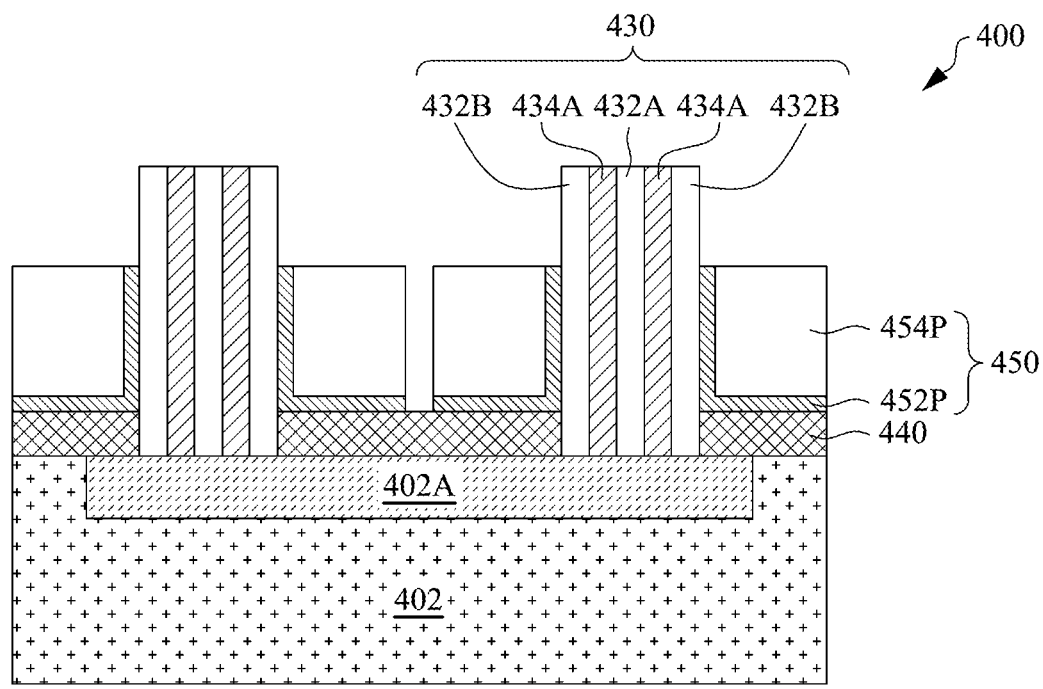

At operation 318, the method 300 (FIG. 3) forms gate structures 450 laterally contacting sidewalls of channel regions of respective superlattice structures 430, in accordance with some embodiments. FIG. 4I is a cross-sectional review of the semiconductor structure 400 of FIG. 4H after forming the gate structures 450 laterally contacting the sidewalls of the channel regions of respective superlattice structures 430, in accordance with some embodiments.

Referring to FIG. 4I, each of the gate structures 450 includes a gate dielectric 452P and a gate electrode 454P. The gate structures 450 can be formed by first recessing the gate electrode layer 454 by an etch. The etch can be a dry etch such as, for example, RIE or a wet etch that removes the conductive metal that provides the gate electrode layer 454 selective to the dielectric material that provides the gate dielectric layer 452. After recessing the gate electrode layer 454, a remaining portion of the gate electrode layer 454 has a top surface below the top surfaces of the superlattice structures 430. Next, portions of the remaining portion of the gate electrode layer 454 located between adjacent superlattice structures 430 are removed by lithography and etching, thereby providing the gate electrodes 454P. For example, a photoresist layer is applied over the remaining portion of gate electrode layer 454 and lithographically patterned so the patterned photoresist layer covers portions of the remaining portion of the gate electrode layer 454 where the gate electrodes 454P are to be formed. An anisotropic etch is then performed to remove the portions of the remaining portion of the gate electrode layer 454 that are not covered by the patterned photoresist layer to provide the gate electrodes 454P. The anisotropic etch can be a dry etch such as, for example, RIE or a wet etch. The patterned photoresist layer can be subsequently removed, for example, by ashing.

Next, portions of the gate dielectric gate layer 452 that are not covered by the gate electrode 454P are removed by an anisotropic etch. The anisotropic etch can be a dry etch such as, for example, ME or a wet etch that removes the dielectric material that provides the gate dielectric layer 452 selective to the semiconductor materials that provides the superlattice structures 430. The remaining portions of the gate dielectric layer 452 beneath the gate electrodes 454P constitutes the gate dielectrics 452P. The gate dielectrics 452P contact the sidewalls of the channel regions of the respective superlattice structures 430. The etching of the gate dielectric layer 452 exposes a top surface of the insulator layer 440.

Figure 4J:
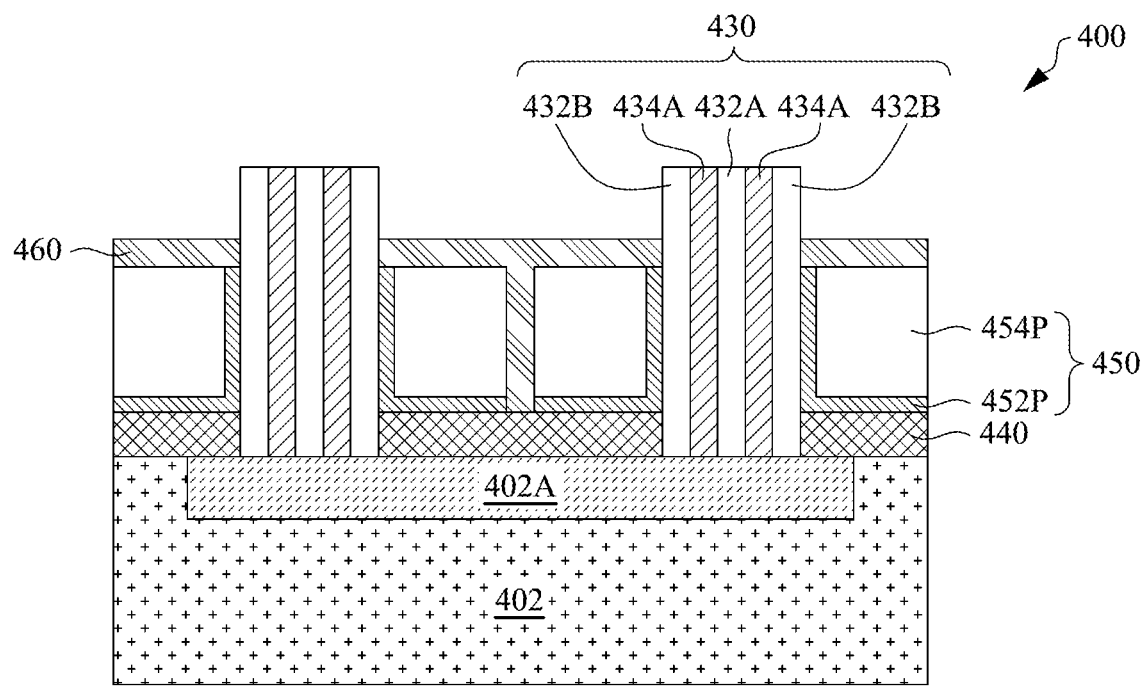

At operation 320, the method 300 (FIG. 3) deposits a dielectric spacer layer 460 over the gate structures 450 and the insulator layer 440, in accordance with some embodiments. FIG. 4J is a cross-sectional review of the semiconductor structure 400 of FIG. 4I after depositing the dielectric spacer layer 460 over the gate structures 450 and the insulator layer 440, in accordance with some embodiments.

Referring to FIG. 4J, the dielectric spacer layer 460 is present on the gate electrodes 454P for separating the gate electrodes 454P from top source/drain structures of vertical FETs subsequently formed. The dielectric spacer layer 460 is also present between adjacent gate structures 450 to electrically isolate the gate structures 450 from each other. In some embodiments, the dielectric spacer layer 460 includes a dielectric material such as, for example, silicon oxide or silicon nitride. In some embodiments, the dielectric spacer layer 460 is deposited by a deposition process such as, for example, CVD or PVD. In some embodiments, the dielectric spacer layer 460 is deposited to have a top surface below the top surfaces of the superlattice structures 430, thereby exposing a top portion of each of the superlattice structures 430.

Figure 4K:
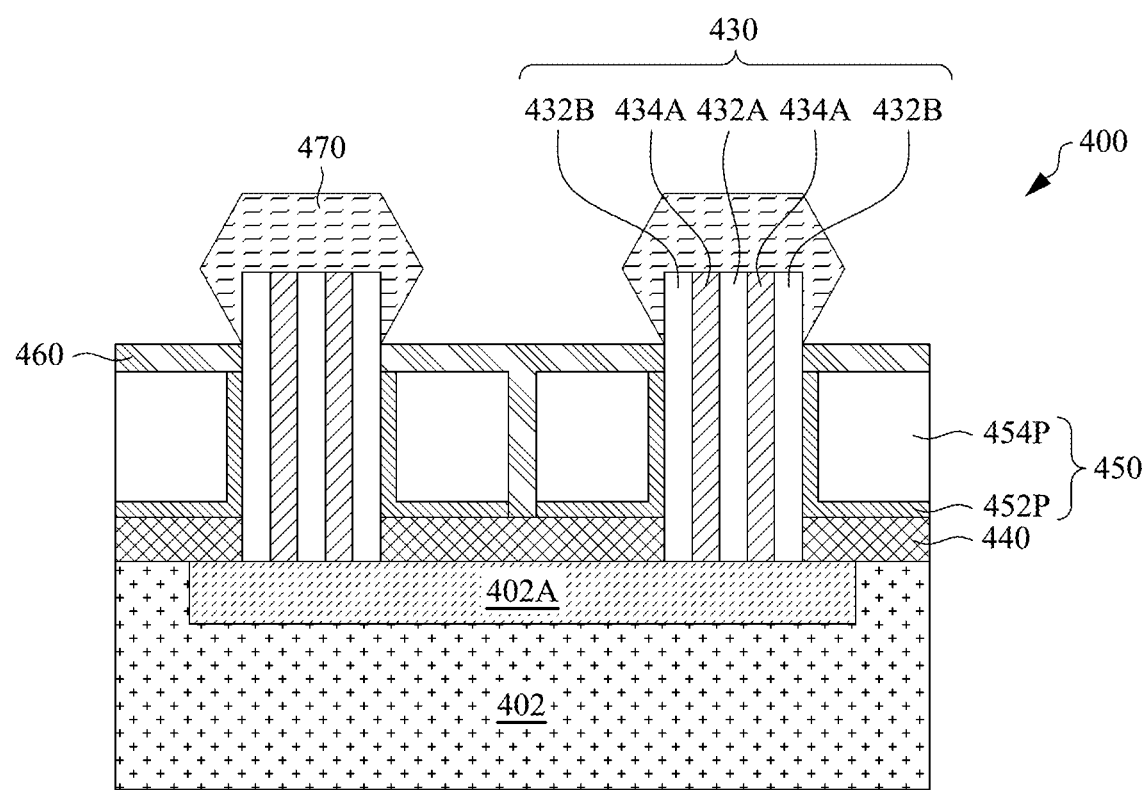

At operation 322, the method 300 (FIG. 3) forms a doped epitaxial region 470 around the top portion of each of the superlattice structures 430, in accordance with some embodiments. FIG. 4K is a cross-sectional review of the semiconductor structure 400 of FIG. 4J after forming the doped epitaxial region 470 around the top portion of each of the superlattice structures 430, in accordance with some embodiments.

Referring to FIG. 4K, the doped epitaxial regions 470 include a semiconductor material such as, for example, Si, Ge, SiGe, SiC, or SiGeC. The doped epitaxial regions 470 function as top source/drain structures for vertical FETs. The doped epitaxial regions 470 thus contain dopants having a conductivity type the same as the conductivity type of the dopants in the doped semiconductor region 402A. For example, for n-type vertical FETs, both doped epitaxial regions 470 and the doped semiconductor region 402A contain n-type dopants. Whereas, for p-type FETs both doped epitaxial regions 470 and the doped semiconductor region 402A in the substrate 402 contain p-type dopants. In some embodiments, the dopant concentration of the doped epitaxial regions 470 can be from $1 \times 10^{19}$ atoms/cm$^3$ to $1 \times 10^{22}$ atoms/cm$^3$, although lesser and greater dopant concentration can also be employed.

In some embodiments, the doped epitaxial regions 470 are formed utilizing a selective epitaxial growth process. During the selective epitaxial growth, the semiconductor material that provides the doped epitaxial regions 470 only grows from the semiconductor surfaces including physically exposed topmost surfaces and sidewall surfaces of the top portions of the superlattice structures 430, but not from the dielectric surface such as the top surface of the dielectric spacer layer 460. The dopants can be provided during the selective epitaxial growth process by in-situ doping, or after the selective epitaxial growth process by ion implantation or gas phase doping.

Vertical FETs are thus formed. Each vertical FET includes a superlattice structure 430 extending upwards from a substrate 402, a doped semiconductor region 402A beneath the superlattice structure 430 as a bottom source/drain structure, a doped epitaxial region 470 contacting a top surface and sidewalls of a top portion of the superlattice structure 430 as a top source/drain structure, and a gate structure including a gate dielectric 452P and a gate electrode 454P laterally contacting a channel region of the superlattice structure 430. The superlattice structure 430 includes alternating nanosheets of a first semiconductor material (i.e., first and third nanosheets 432A, 432B) and nanosheets of a second semiconductor material (second nanosheets 434A) arranged in a lateral direction and perpendicular to the substrate 402. Comparing to using a nanosheet of a single semiconductor material as the channel of a vertical FET, using a superlattice structure comprising nanosheets of different semiconductor materials as the channel in a vertical FET helps to improve carrier mobility and reduce leakage current due to the reduced surface defects in the superlattice structure. As a result, the device performance is increased.

One aspect of this description relates to a semiconductor structure. The semiconductor structure includes a substrate and a first superlattice structure and a second superlattice structure over the substrate. The second superlattice structure is disposed over the first superlattice structure. Each of the first superlattice structures and the second superlattice structure includes vertically stacked alternating first nanosheets of a first semiconductor material and second nanosheets of a second semiconductor material that is different from the first semiconductor material. The semiconductor further includes a gate stack that surrounds a channel region of each of the first superlattice structure and the second superlattice structure and source/drain structures on opposite sides of the gate stack. The source/drain structures contact sidewalls of the first superlattice structure and the second superlattice structure.

Another aspect of this description relates to a method for forming a semiconductor structure. The method includes forming a fin structure containing vertically stacked alternating superlattice layers and sacrificial layers on a substrate. Each of the superlattice layers includes alternating first layers of a first semiconductor material and second layers of a second semiconductor material different from the first semiconductor material. The method further includes forming a sacrificial gate structure straddling a portion of the fin structure. The sacrificial gate structure includes a sacrificial gate stack and gate spacers on sidewalls of the sacrificial gate stack. The method further includes removing portions of the fin structure that are not covered by the sacrificial gate structure to provide a fin segment comprising vertically stacked alternating superlattice structures and sacrificial structures, forming source/drain structures on end walls of the fin segment, depositing a dielectric layer over the source/drain structures, removing the sacrificial gate stack to provide a gate cavity, removing the sacrificial structures, and forming a gate stack that wraps around each of the superlattice structures.

Still another aspect of this description relates to a semiconductor structure. The semiconductor structure includes a superlattice structure extending upward from a substrate. The superlattice structure including alternating first nanosheets of a first semiconductor material and second nanosheets of a second semiconductor material aligned perpendicular to the substrate. The first semiconductor material is different from the second semiconductor material. The semiconductor structure further includes a gate structure laterally contacting a channel region of the superlattice structure, and a doped epitaxial region surrounding a top portion of the superlattice structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a first superlattice structure and a second superlattice structure over the substrate, wherein the second superlattice structure is disposed over the first superlattice structure, each of the first superlattice structures and the second superlattice structure comprises vertically stacked alternating first nanosheets of a first semiconductor material and second nanosheets of a second semiconductor material that is different from the first semiconductor material;
   a gate stack that surrounds a channel region of each of the first superlattice structure and the second superlattice structure; and
   source/drain structures on opposite sides of the gate stack, the source/drain structures contacting sidewalls of the first superlattice structure and the second superlattice structure.

2. The semiconductor structure of claim 1, wherein the gate stack comprises a first portion located above the second superlattice structure, and a second portion filling a first space between the first superlattice structure and the second superlattice structure and a second space between the first superlattice structure and the substrate.

3. The semiconductor structure of claim 2, wherein the first portion of the gate stack comprises a U-shaped gate dielectric contacting a top surface of the second superlattice structure and a gate electrode surrounded by the U-shaped gate dielectric.

4. The semiconductor structure of claim 2, further comprising gate spacers on sidewalls of the first portion of the gate stack.

5. The semiconductor structure of claim 2, further comprising inner spacers on sidewalls of the second portion of the gate stack.

6. The semiconductor structure of claim 5, wherein sidewalls of the inner spacers are vertically aligned with the sidewalls of the first superlattice structure and the second superlattice structure.

7. The semiconductor structure of claim 1, wherein the first nanosheets comprise silicon and the second nanosheets comprise silicon germanium or germanium.

8. The semiconductor structure of claim 1, wherein each of the first nanosheets and the second nanosheets has a thickness ranging from about 1 nm to about 10 nm.

9. The semiconductor structure of claim 1, further comprising a dielectric layer on the source/drain structures, the dielectric layer surrounding the gate stack.

10. A method for forming a semiconductor structure, comprising:

forming a fin structure comprising vertically stacked alternating superlattice layers and sacrificial layers on a substrate, each of the superlattice layers comprising alternating first layers of a first semiconductor material and second layers of a second semiconductor material different from the first semiconductor material;

forming a sacrificial gate structure straddling a portion of the fin structure, the sacrificial gate structure comprising a sacrificial gate stack and gate spacers on sidewalls of the sacrificial gate stack;

removing portions of the fin structure that are not covered by the sacrificial gate structure to provide a fin segment comprising vertically stacked alternating superlattice structures and sacrificial structures;

forming source/drain structures on end walls of the fin segment;

depositing a dielectric layer over the source/drain structures;

removing the sacrificial gate stack to provide a gate cavity;

removing the sacrificial structures; and forming a gate stack that wraps around each of the superlattice structures.

11. The method of claim 10, wherein the removing the sacrificial structures comprises performing an isotropic etch configured to selectively remove the sacrificial structures relative to the superlattice structures, wherein the removing the sacrificial structures provides first spaces between the superlattice structures.

12. The method of claim 11, further comprising etching the substrate to form a second space below a bottommost superlattice structure of the superlattice structures.

13. The method of claim 12, wherein the forming the gate stack comprises:

depositing a gate dielectric over exposed surfaces of the superlattice structures and the gate cavity; and depositing a gate electrode over the gate dielectric, the gate electrode filling the gate cavity, the first spaces and the second space.

14. The method of claim 10, wherein the forming the fin structure comprises:

forming a multilayer stack over the substrate, wherein the multilayer stack including the vertically stacked alternating superlattice layers and sacrificial layers; and etching the vertically stacked alternating superlattice layers and sacrificial layers by at least one anisotropic etch.

15. The method of claim 10, wherein the forming the source/drain structures comprises epitaxially growing a third semiconductor material from end walls of the fin segment.

16. The method of claim 10, further comprising:

etching end portions of the sacrificial structures to form recesses; and forming inner spacers in the recesses.

17. A semiconductor structure, comprising:

a superlattice structure extending upward from a substrate, wherein the superlattice structure comprises alternating first nanosheets of a first semiconductor material and second nanosheets of a second semiconductor material aligned perpendicular to the substrate, the first semiconductor material is different from the second semiconductor material;

a gate structure laterally contacting a channel region of the superlattice structure; and a doped epitaxial region surrounding a top portion of the superlattice structure.

18. The semiconductor structure of claim 17, further comprising a dielectric spacer layer between the gate structure and the doped epitaxial region.

19. The semiconductor structure of claim 17, further comprising an insulator layer surrounding a bottom portion of the superlattice structure.

20. The semiconductor structure of claim 17, further comprising a doped semiconductor region in the substrate underlying the superlattice structure.

* * * * *